(12) United States Patent
Van Lare et al.

(10) Patent No.: US 12,197,120 B2
(45) Date of Patent: Jan. 14, 2025

(54) PATTERNING DEVICE AND METHOD OF USE THEREOF

(71) Applicant: ASML NETHERLANDS B.V., Veldhoven (NL)

(72) Inventors: Marie-Claire Van Lare, Utrecht (NL); Frank Jan Timmermans, Eindhoven (NL); Friso Wittebrood, Cuijk (NL); John Martin McNamara, Veldhoven (NL); Jozef Maria Finders, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 17/426,806

(22) PCT Filed: Jan. 2, 2020

(86) PCT No.: PCT/EP2020/050032
§ 371 (c)(1),
(2) Date: Jul. 29, 2021

(87) PCT Pub. No.: WO2020/160851
PCT Pub. Date: Aug. 13, 2020

(65) Prior Publication Data
US 2022/0121105 A1  Apr. 21, 2022

(30) Foreign Application Priority Data

Feb. 7, 2019 (EP) .................................... 19156029
May 16, 2019 (EP) .................................... 19174809

(51) Int. Cl.
*G03F 1/24* (2012.01)
*G03F 1/26* (2012.01)
(Continued)

(52) U.S. Cl.
CPC .................. *G03F 1/32* (2013.01); *G03F 1/24* (2013.01); *G03F 1/26* (2013.01); *G03F 7/20* (2013.01)

(58) Field of Classification Search
CPC .................................................... G03F 1/22–24
See application file for complete search history.

(56) References Cited

U.S. PATENT DOCUMENTS

2003/0039923 A1* 2/2003 Mangat ...................... G03F 1/24
430/312
2003/0123605 A1* 7/2003 Rau ........................... G03F 1/74
430/5

(Continued)

FOREIGN PATENT DOCUMENTS

| JP | 2003243292 A | * 8/2003 | ............. B82Y 10/00 |
| WO | 2017/169658 | 10/2017 | |
| WO | WO-2019225736 A1 | * 11/2019 | ............... G03F 1/24 |

OTHER PUBLICATIONS

JP2018100362 (priority document, No. date).*

(Continued)

*Primary Examiner* — Martin J Angebranndt
(74) *Attorney, Agent, or Firm* — Pillsbury Winthrop Shaw Pittman, LLP

(57) ABSTRACT

An attenuated phase shift patterning device including a first component for reflecting radiation, and a second component for reflecting radiation with a different phase with respect to the radiation reflected from the first component, the second component covering at least a portion of the surface of the first component such that a pattern including at least one uncovered portion of the first component is formed for generating a patterned radiation beam in a lithographic apparatus in use, wherein the second component includes a (Continued)

material having a refractive index with a real part (n) being less than 0.95 and an imaginary part (k) being less than 0.04.

22 Claims, 15 Drawing Sheets

(51) Int. Cl.
   *G03F 1/32* (2012.01)
   *G03F 7/20* (2006.01)

(56) References Cited

U.S. PATENT DOCUMENTS

| | | | | |
|---|---|---|---|---|
| 2005/0147894 A1* | 7/2005 | Lee | G03F 1/32 | 428/428 |
| 2006/0088772 A1* | 4/2006 | Zhang | G03F 1/20 | 430/30 |
| 2007/0281218 A1* | 12/2007 | Landis | G03F 1/30 | 430/394 |
| 2009/0142675 A1* | 6/2009 | Kim | G03F 1/44 | 430/5 |
| 2009/0181314 A1* | 7/2009 | Shyu | G03F 1/80 | 430/5 |
| 2011/0020737 A1* | 1/2011 | Kamo | G03F 1/24 | 430/5 |
| 2011/0159410 A1* | 6/2011 | Lin | G03F 1/24 | 430/5 |
| 2014/0011120 A1* | 1/2014 | Lu | G03F 1/24 | 430/5 |
| 2014/0113222 A1* | 4/2014 | Lu | G03F 1/24 | 430/5 |
| 2015/0098069 A1 | 4/2015 | Lu et al. | | |
| 2015/0147687 A1* | 5/2015 | Lu | G03F 7/2002 | 430/5 |
| 2015/0168845 A1* | 6/2015 | Lu | G03F 7/70441 | 355/71 |
| 2015/0261084 A1* | 9/2015 | Stephens | G03F 1/72 | 430/5 |
| 2016/0238924 A1 | 8/2016 | Burkhardt et al. | | |
| 2017/0038673 A1 | 2/2017 | Ikebe et al. | | |
| 2018/0067390 A1* | 3/2018 | Kwon | G03F 1/52 | |
| 2018/0174839 A1* | 6/2018 | Lin | G03F 1/36 | |
| 2018/0299766 A1* | 10/2018 | Tanabe | G03F 1/54 | |
| 2019/0056653 A1* | 2/2019 | Kawahara | G03F 1/48 | |
| 2019/0384156 A1* | 12/2019 | Tanabe | G03F 1/54 | |
| 2020/0033736 A1* | 1/2020 | Bristol | G03F 7/70033 | |

OTHER PUBLICATIONS

International Search Report and Written Opinion issued in corresponding PCT Patent Application No. PCT/EP2020/050032, dated Apr. 3, 2020.

Lee, S. et al.: "Improved imaging properties of thin attenuated phase shift masks for extreme ultraviolet lithography", Journal of Vacuum Science & Technology B: Microelectronics and Nanometer Structures, vol. 31, No. 2 (Feb. 2013).

Communication issued in corresponding European Patent Application No. 20700180.1, dated Oct. 18, 2023.

Office Action issued in corresponding Israeli Patent Application No. 284766, dated Jun. 9, 2023.

\* cited by examiner

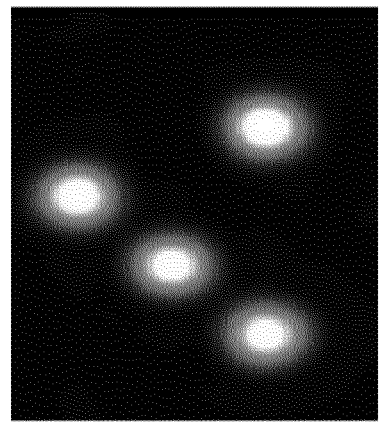
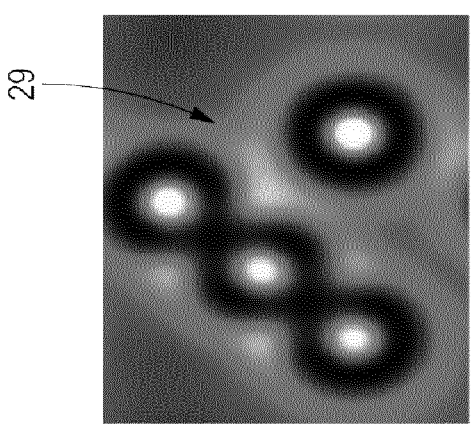
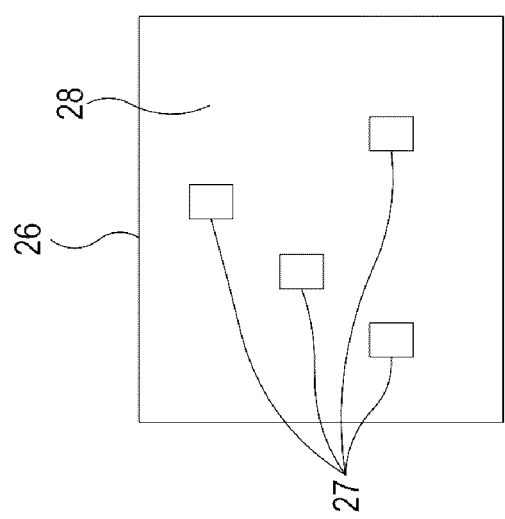
Fig. 7c
Fig. 7b
Fig. 7a

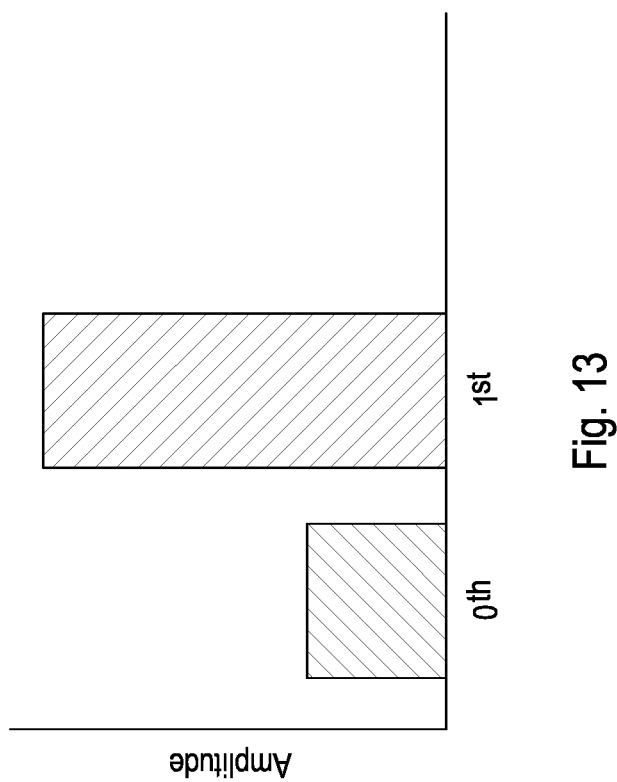

PATTERNING DEVICE AND METHOD OF USE THEREOF

CROSS-REFERENCE TO RELATED APPLICATIONS

This application is the U.S. national phase entry of PCT Patent Application No. PCT/EP2020/050032 which was filed Jan. 2, 2020, which claims the benefit of priority of European Patent Application No. 19156029.1 which was filed on Feb. 7, 2019 and of European Patent Application No. 19174809.4 which was filed on May 16, 2019, each of which is incorporated herein in its entirety by reference.

FIELD

The present invention relates to a patterning device and method of use of the patterning device. More particularly, it relates to an attenuated phase shift patterning device.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask or reticle or a fiducial) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

In a lithographic apparatus, increasing the numerical aperture (NA) of the objective lens results in improved critical dimension uniformity and higher effective throughput. As the NA of the lithographic apparatus increases, the depth of focus reduces. Techniques such as source-mask optimization (SMO) can be used to trade-off Normalised Image Log Slope (NILS) with depth of focus. However, when NILS-through-focus needs to be high, this becomes increasingly challenging. Consequentially, it is challenging to provide sufficient focal range when the optical contrast is within specification. Therefore, it may be desired to enhance NILS-through-focus.

SUMMARY

According to a first aspect of the invention, there is provided an attenuated phase shift patterning device comprising a first component for reflecting radiation, and a second component for reflecting radiation with a different phase with respect to the radiation reflected from the first component, the second component covering at least a portion of the surface of the first component such that a pattern comprising at least one uncovered portion of the first component is formed for generating a patterned radiation beam in a lithographic apparatus in use, wherein the second component comprises a material having a refractive index with a real part (n) being less than 0.95 and an imaginary part (k) being less than 0.04.

This may provide an advantage of a more accurate pattern on the substrate due to a reduced patterning device 3D effect. The attenuated patterning device may provide an advantage of a relatively high NILS and a relatively low pattern shift. This may have an advantage of providing a relatively strongly enhanced NILS through focus. This may ultimately improve yield of a lithographic apparatus.

The second component may comprise at least one of Ru, Rh, Tc and Re.

The second component may comprise an alloy comprising at least one of Ru, Rh, Tc and Re.

The second component may have a thickness in the range 30 to 45 nm. The thickness of the second component may be greater than or equal to 30 nm and the thickness of the second component may be less than or equal to 45 nm.

The second component may have a thickness in the range 33 to 41 nm. The second component may have a thickness of greater than or equal to 33 nm and the second component may have a thickness less than or equal to 41 nm.

The second component may have a thickness of 35 or 41 nm.

The second component may cover the portion of the first component which extends a distance of at least 10 nm from the at least one uncovered portion of the first component. The second component may have a width of at least 10 nm.

The second component may be in direct contact with the first component. The second component may be not in direct contact with the first component.

The attenuated phase shift patterning device may further comprise a third component for absorbing radiation, the third component may comprise a material having a refractive index with a larger imaginary part (k) than the material of the second component, the third component may cover at least a portion of the first component.

This may provide an advantage of suppressing background intensity in an aerial image. This may have an advantage of providing a relatively strongly enhanced NILS through focus for isolated patterns.

The material of the third component may have a refractive index with an imaginary part (k) in the range 0.031 to 0.08.

The third component may cover the portion of the first component which is greater than or equal to a distance in the range 20 to 240 nm from the at least one uncovered portion of the first component.

The third component may not cover the second component. The third component and the second component may be in the same layer.

The third component may be in direct contact with the first component. The third component may be not in direct contact with the first component.

The third component may cover at least a portion of the second component. The third component and the second component may be in different layers. The third component may be located on the second component.

The third component may be in direct contact with the second component. The third component may be not in direct contact with the second component.

The third component may comprise at least one of Ta, Ag, Pt, Pd, Au, Ir, Os, Re, In, Co, Cd, Pb, Fe, Hg, TI, Cu, Zn, I, Te, Ga, Cr, W, Hf, TaBN, and an alloy comprising one or more of Ta, Ag, Pt, Pd, Au, Ir, Os, Re, In, Co, Cd, Pb, Fe, Hg, TI, Cu, Zn, I, Te, Ga, Cr, W, and Hf.

The second component may cover the entire first component except the at least one uncovered portion of the first component.

The second component may have an arrangement configured to reduce the radiation diffracted into the zeroth diffraction order and wherein the arrangement has a sub-resolution pitch. This may have the advantage of providing an enhanced NILS and improved dose whilst suppressing background for isolated patterns.

The radiation diffracted into the zeroth diffraction order may be less than the radiation diffracted into higher diffraction orders.

The arrangement may have a repeating pattern of sections of the second component across the attenuated phase shift patterning device, the sections of the second component being separated by spaces such that there are further uncovered portions of the first component.

The sections of the second component may extend perpendicularly to the direction of the repeating pattern across the attenuated phase shift patterning device, the sections of the second component may be separated by channels. The channels may be the spaces.

The second component may comprise a material having a refractive index with a real part (n) of less than 0.91 and an imaginary part (k) greater than 0.03. This may have the advantage of providing an enhanced NILS and a relatively low pattern shift whilst also suppressing background for isolated patterns.

The second component may comprise at least one of Ru, Pt, Ta or Co.

The second component may comprise an alloy of Ru and Co.

The second component may comprise an alloy of ⅔ Ru and ⅓ Co.

The second component may have a thickness in the range 34-55 nm.

The second component may have a thickness of 41 nm.

The first component may be a multilayer.

The pattern may comprise a plurality of uncovered portions of the first component.

According to a second aspect of the invention, there is provided a method of using an attenuated phase shift patterning device, comprising reflecting radiation from a first component of the attenuated phase shift patterning device, and reflecting radiation from a second component of the attenuated phase shift patterning device such that the radiation reflected from the second component has a different phase with respect to the radiation reflected from the first component, the second component covering at least a portion of the surface of the first component such that a pattern comprising at least one uncovered portion of the first component is formed for generating a patterned radiation beam, wherein the second component comprises a material having a refractive index with a real part (n) being less than 0.95 and an imaginary part (k) being less than 0.04.

The method may further comprise absorbing radiation using a third component having a refractive index with a larger imaginary part (k) than the second component, the third component covering at least a portion of the first component.

It will be appreciated that one or more aspects or features described above or referred to in the following description may be combined with one or more other aspects or features.

BRIEF DESCRIPTION OF THE DRAWINGS

Embodiments of the invention will now be described, by way of example only, with reference to the accompanying schematic drawings, in which:

FIG. 2b depicts a schematic diagram of a top view of an attenuated phase shift patterning device in accordance with the embodiment of FIG. 2a;

FIG. 7a depicts a patterning device layout for isolated patterns;

FIG. 7b depicts an isolated patterns aerial image having a background;

FIG. 7c depicts an isolated patterns aerial image without a background;

FIG. 8b depicts a schematic diagram of a top view of an attenuated phase shift patterning device in accordance with the embodiment of FIG. 8a;

FIG. 9b depicts a schematic diagram of a top view of an attenuated phase shift patterning device in accordance with the embodiment of FIG. 9a.

FIG. 10b depicts a graph showing dose for the same patterning devices as in FIG. 10a.

FIG. 12b depicts a schematic diagram of a top view of an attenuated phase shift patterning device in accordance with the embodiment of FIG. 12a.

FIG. 13 depicts a graph showing amplitude ratio to higher diffraction orders using the attenuated phase shift patterning device in accordance with the embodiment of FIG. 12a.

DETAILED DESCRIPTION

Figure 1:
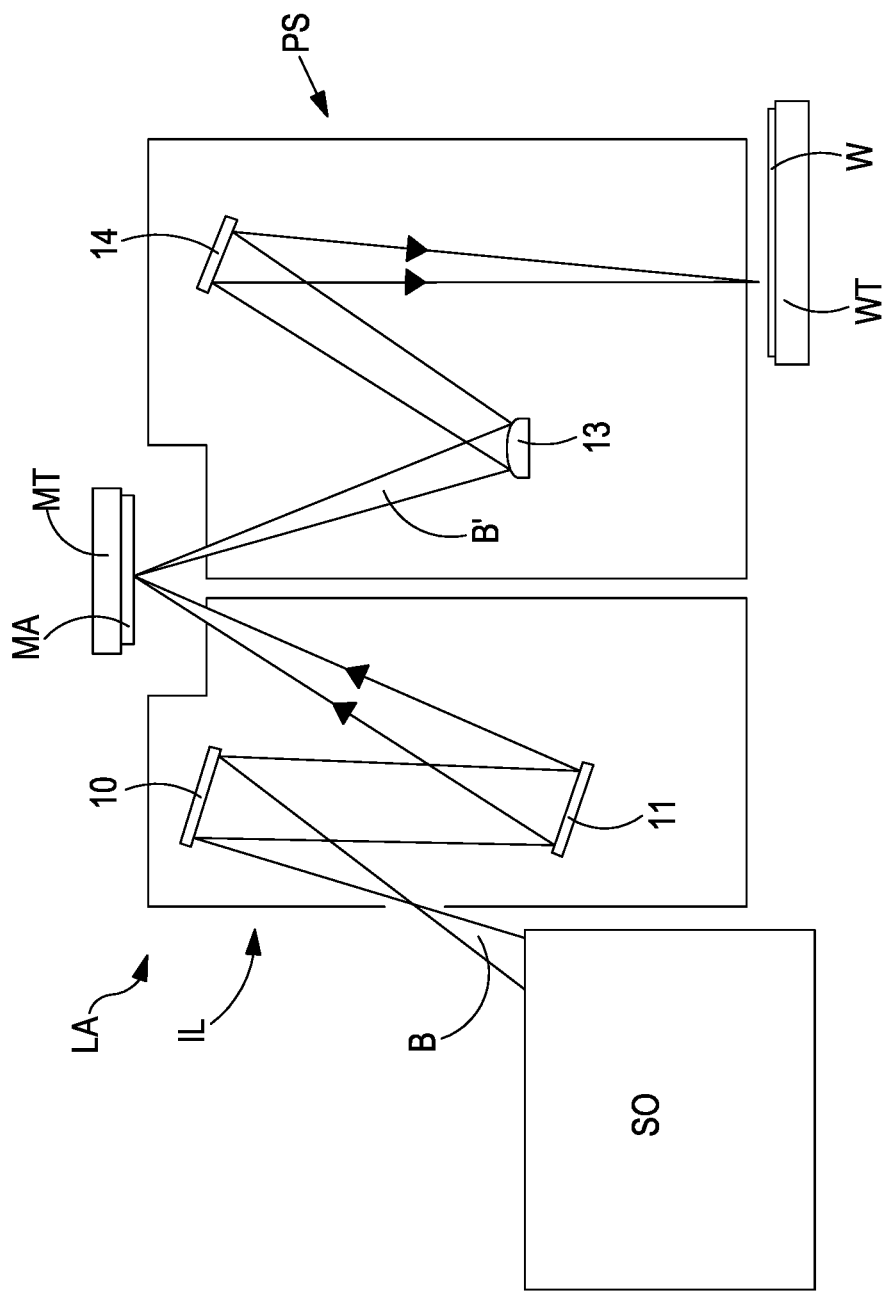
FIG. 1 depicts a schematic diagram of a lithographic system comprising a lithographic apparatus and a radiation source in accordance with an embodiment of the invention.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask or reticle), a projection system PS and a substrate table WT configured to support a substrate W. A dedicated piece of hardware, often referred to as a fiducial, may be provided on the support structure MT. Such a fiducial may include one or more markers and is considered to be an example of a patterning device.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13, 14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13, 14 in FIG. 1, the projection system PS may include a different number of mirrors (e.g. six or eight mirrors). The projection system PS may project the patterned EUV radiation beam B' onto a sensor (not shown) instead of the substrate W.

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO may be a laser produced plasma (LPP) source, a discharge produced plasma (DPP) source, a free electron laser (FEL) or any other radiation source that is capable of generating EUV radiation.

Figure 2B:
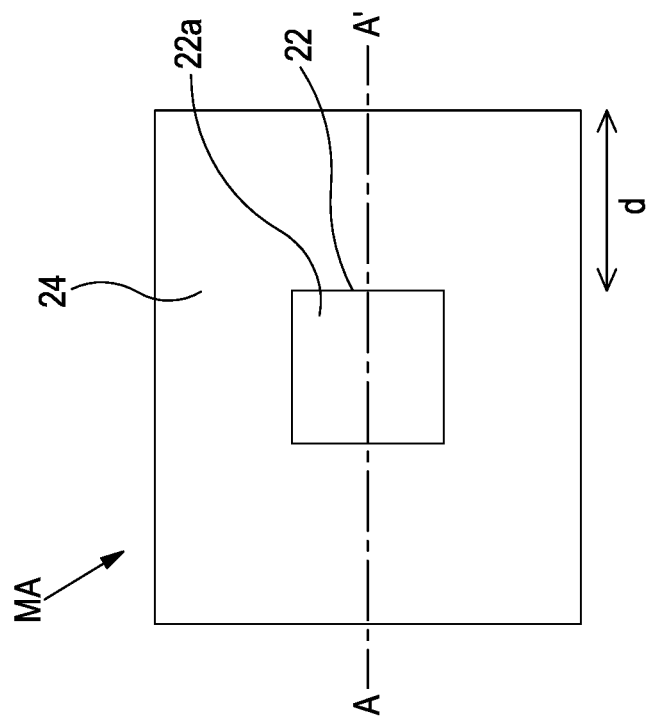
Figure 2A:
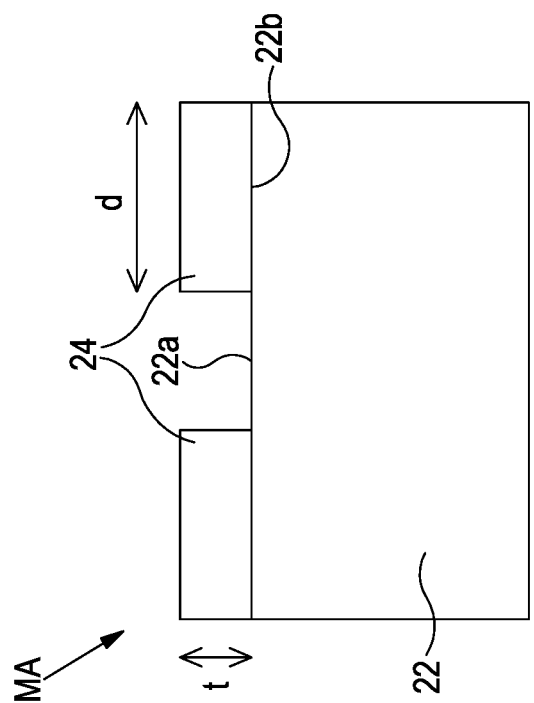
FIG. 2a depicts a schematic diagram of a cross sectional side view of an attenuated phase shift patterning device in accordance with an embodiment of the invention.

FIG. 2a shows a close up side view of part of the patterning device MA, which in this embodiment is an attenuated phase shift patterning device. More particularly, FIG. 2a shows a cross sectional side view of the attenuated phase shift patterning device MA taken through line A-A' of FIG. 2b. A part of the attenuated phase shift patterning device MA is shown in FIG. 2b in a top view. It will be appreciated that FIGS. 2a and 2b show only part of the attenuated phase shift patterning device MA for clarity as will become apparent.

Phase shift patterning devices are photomasks that take advantage of the interference generated by phase differences to improve image resolution in photolithography. A phase shift patterning device relies on the fact that radiation passing through a transparent media (i.e. in this case being reflected from that media) will undergo a phase change as a function of its optical thickness.

The attenuated phase shift patterning device MA comprises a first component 22 for reflecting radiation and a second component 24 for reflecting radiation with a different phase with respect to the radiation reflected from the first component. The first component 22 comprises a standard multilayer mirror, e.g. alternating layers of molybdenum and silicon. The layers of the multilayer are not shown in FIG. 2a for simplicity. It will be appreciated that in other embodiments, the first component may have different numbers of layers and/or may comprise different materials.

The second component 24 is in a different layer from the first component 22, i.e. the second component 24 is located on the first component 22.

The second component 24 reflects a relatively small amount of radiation when compared with the first component 22. The radiation reflected from the second component 24 is not strong enough to create a pattern on the substrate W, but it can interfere with the radiation coming from the first component 22, with the goal of improving the contrast on the substrate W. The contrast may be considered to be the steepness, or sharpness, of the features formed in the image on the substrate W.

As can be seen in FIG. 2a and FIG. 2b, the second component 24 covers a portion (hereinafter referred to as a covered portion 22b) of the first component 22 except for an uncovered portion 22a of the surface of the first component 22 which forms a pattern. Radiation reflected from the uncovered portion 22a generates the patterned radiation beam B' which forms a pattern in a target portion of the substrate W in the lithographic apparatus LA when in use. The second component 24 may be considered to surround the uncovered portion 22a of the first component 22, albeit that the second component 24 is in a different layer from the first component 22 and so it is actually the covered portions 22b that surround the uncovered portions 22a of the first component 22. The second component 24 may be considered to form a ring around the uncovered portion 22a of the first component 22. Although the area of the uncovered portion 22a of the first component 22 is shown as substantially a square or rectangle from above, in other embodiments, the uncovered portion may be any suitable shape and the second component may have a size and shape accordingly. The size of the uncovered portion 22a is related to the critical dimension (CD) of the feature to be printed on the substrate W. On the patterning device MA, the size of the uncovered portion 22a is the CD (on the substrate W) multiplied by the magnification factor in the lithographic apparatus LA. This may have a range of +/−30% (patterning device bias range). The magnification factor may be 4-8.

The second component 24 covers the covered portion 22b of the first component 22 which extends a distance of 10 nm from the uncovered portion 22a of the first component 22. It may be considered that the second component 24 extends this distance from the uncovered portion 22a of the first component 22. This distance being taken parallel to the surface of the first component 22, i.e. it may be considered to be taken along an interface between the first component 22 and the second component 24. In other words, the second component 24 has a width d of 10 nm which obviously corresponds to the extent in that direction of the covered portion 22b of the first component 22. The width d is depicted as a double arrow in FIGS. 2a and 2b. It will be appreciated that in other embodiments, the second component 24 may extend a different distance from the uncovered portion 22a, e.g. it may extend more than 10 nm. Generally, the size of the pattern of the patterning device MA may be the same as for a conventional mask. The pattern of the patterning device MA equals the pattern that is desired to be printed on the substrate multiplied by a mask magnification factor. The mask magnification factor may be 4-8. In some embodiments, the second component 24 covers the entire first component 22 except from the uncovered portion 22a of the first component 22.

Although only a single uncovered portion 22a is shown in FIGS. 2a and 2b, (because these Figures only show part of the attenuated phase shift patterning device MA), it will be appreciated that the pattern may be formed of a plurality of uncovered portions 22a. The pattern may be a dense pattern or may be an isolated pattern. A pattern may be considered to be dense when the critical dimension (CD), c.f. the size of the uncovered portion, is at least half of the pitch of the pattern. A pattern may be considered to be isolated where the pitch is increased and therefore the CD (c.f. the size of the uncovered portion) is less than half of the pitch of the pattern. Each of the plurality of uncovered portions 22a may be surrounded by covered portions 22b of the first component 22. The portions of the second component 24 adjacent to the uncovered portions 22a may extend a distance of 10 nm from the uncovered portions 22a in the direction parallel to the surface of the first component 22. This being the same as the distance the covered portions 22b extend in that direction. In some embodiments, the second component 24 may extend more than 10 nm in the direction parallel to the surface of the first component 22. In some embodiments, the second component 24 covers the entire first component 22 except from the uncovered portions 22a of the first component 22.

The terms cover/covered/covering as used within this description is intended to mean that the covering component is in a position such that radiation is at least partially blocked from being incident on the portion of the covered component underneath the covering component. That is, covering may be taken to encompass covering where the covering component is in direct contact with the covered component or not, i.e. another component may or may not be located between the component that is covering and the component being covered.

In this embodiment, the second component 24 comprises the material Ruthenium (Ru) with a thickness t (shown as a double arrow in FIGS. 2a and 2b) of 35 nm. The material Ru of the second component 24 may be considered to have replaced an absorbing material, e.g. a TaBN absorber, in a standard patterning device to form the attenuated phase shift patterning device MA. As will be appreciated, in other embodiments, different materials may be used in place of Ru, as detailed later.

The Ru acts as a phase shift material and it has been found to be a particularly good material to use in the attenuated phase shift patterning device MA. Furthermore, the thickness of 35 nm has been found to provide an optimal phase shift. As will be appreciated, in other embodiments, different thicknesses may also be used, as detailed later.

The attenuated phase shift patterning device MA may be used in the lithographic apparatus LA by reflecting radiation from the first component 22 of the attenuated phase shift patterning device MA, and reflecting radiation from the second component 24 of the attenuated phase shift patterning device MA. More particularly, reflecting radiation from the pattern comprising the uncovered portion 22a of the first component 22 and generating the patterned radiation beam B'. The effect of this is that the radiation reflected from the second component 24 has a different phase with respect to the radiation reflected from the first component 22 and provides a pattern on the substrate with increased contrast.

Figure 3:
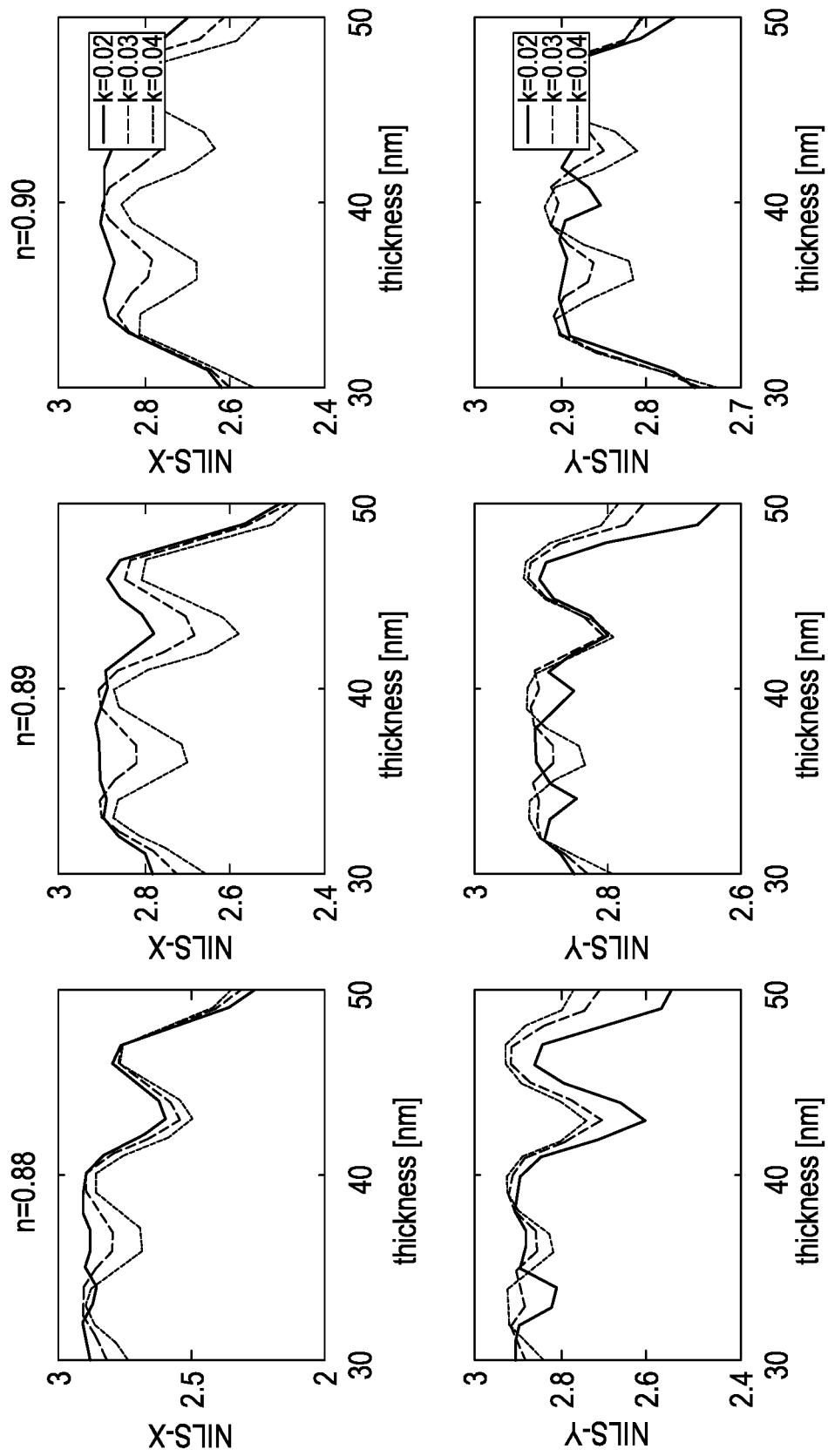
FIG. 3 depicts a series of graphs showing NILS optimization of an attenuated phase shift patterning device in accordance with an embodiment of the invention.

FIG. 3 shows graphs displaying selected results of the Normalised Image Log Slope (NILS) optimisation of the attenuated phase shift patterning device MA. As mentioned previously, as the numerical aperture (NA) of the lithographic apparatus LA increases, the depth of focus reduces. Techniques such as source-mask optimization (SMO) can be used to trade-off NILS with depth of focus. However, it is challenging to maintain a high NILS-through-focus, i.e. a high contrast at different points around the target focal point. The optimization of the attenuated phase shift patterning device MA was done by simulating a monopole source and co-optimizing NILS (max NILS) and pattern shift (min pattern shift). The pattern shift may be considered to a measure of how much the pattern moves for a particular point.

The NILS optimization included simulating a small scan over different thicknesses of the second component 24 with the material having different n and k values. These values could be varied by mixing different elements (e.g. Ru and a material with different n and k). The bottom row of the graphs show the values of NILS for a scan in the Y direction (i.e. the scanning direction of the lithographic apparatus LA) for different thicknesses of the second component 24. The top row of graphs show the values of NILS for a scan in the X direction (i.e. the direction perpendicular to the scanning direction of the lithographic apparatus LA) for different thicknesses of the second component 24. The graphs from left to right have increasing n (i.e. n=0.88, n=0.89 and n=0.90) and the different values of k are shown in different dashed lines (i.e. k=0.02, k=0.03, k=0.04; see key on the right hand side graphs).

As may be seen from the graphs of FIG. 3, the optimum NILS is obtained with n=0.88, k=0.02 and a thickness less than or equal to 45 nm. That is, at these values, the results show a relatively large NILS value. Furthermore, the gradient is not varying very much, which means that small changes in the thickness of the material will not result in significant changes to the contrast of the pattern in the substrate W. The optimum n and k values found in the simulation equal the n and k values of Ru and thus Ru is a particularly good choice to use as the phase shift material.

Figure 4:
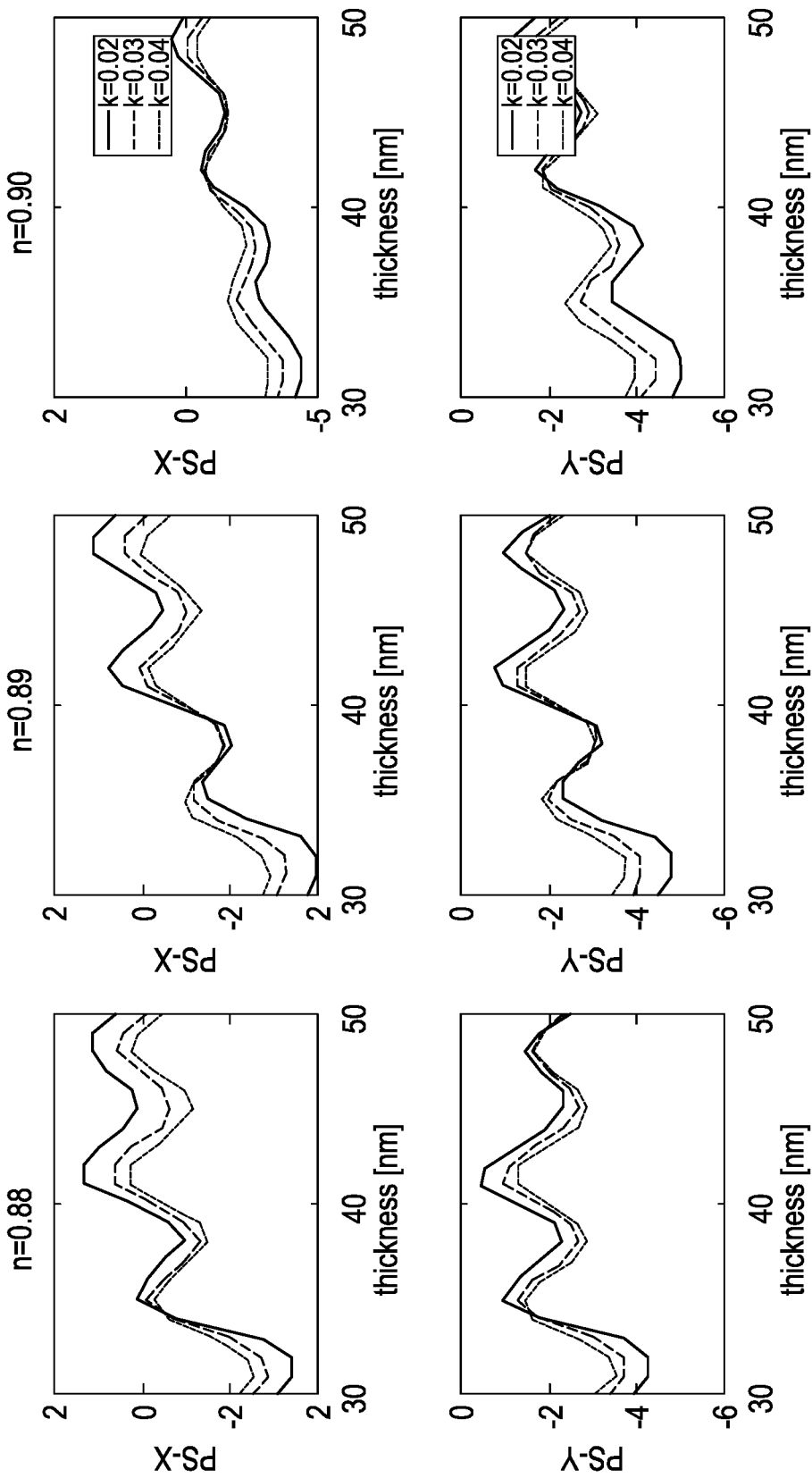
FIG. 4 depicts a series of graphs showing pattern shift optimization of an attenuated phase shift patterning device in accordance with an embodiment of the invention.

FIG. 4 shows graphs displaying selected results of the pattern shift (PS) optimisation of the attenuated phase shift patterning device MA. The bottom row of the graphs show the values of pattern shift for a scan in the Y direction (i.e. the scanning direction of the lithographic apparatus LA) for different thicknesses of the second component 24. The top row of graphs show the values of pattern shift for a scan in the X direction (i.e. the direction perpendicular to the scanning direction of the lithographic apparatus LA) for different thicknesses of the second component 24. Again the graphs from left to right have increasing n (i.e. n=0.88, n=0.89 and n=0.90) and the different values of k are shown in different dashed lines (i.e. k=0.02, k=0.03, k=0.04; see key on the right hand side graphs).

As may be seen from the graphs of FIG. 4, the smallest (i.e. optimum) pattern shift is obtained with n=0.88, k=0.02 and a thickness of 35 nm or 41 nm. That is, at these values, the pattern shift is relatively low.

Taking the NILS optimization and the pattern shift optimization into account, then the best overall result is obtained with a second component 24 having a material with n=0.88, k=0.02 and a thickness of 35 nm or 41 nm. This provides an optimum balance between a relatively high NILS, a relatively low variance of the gradient of thickness against NILS, and a relatively low pattern shift (PS). Therefore, the attenuated phase shift patterning device MA having a second component comprising the material Ru and having a thickness of 35 nm as shown in FIGS. 2a and 2b may be considered to be particularly advantageous.

Using Ru has several advantages when compared to using Ta in the patterning device which ultimately leads to an improved yield of the lithographic apparatus LA. These advantages include obtaining a larger phase shift, which means a larger NILS (i.e. an enhanced contrast of the features on the substrate W).

Generally, the patterning device having a finite thickness (i.e. a 3D effect) leads to artefacts, i.e. shadowing, being produced in the lithographic apparatus LA. Since Ru has a refractive index with a relatively low real part (n), then the required phase shift can be obtain in a thinner layer. Thus, the patterning device may be made thinner which leads to a reduced patterning device 3D effect. This provides a more accurate pattern on the substrate W.

In addition, there are relatively low absorption losses in the attenuated phase shift patterning device MA. This is because Ru has a refractive index with a relatively low real part (n) and a relatively low imaginary part (k). Thus, it doesn't absorb as much radiation as other materials that may be used, e.g. Ta, and obtaining the required phase shift in a relatively thin layer means that the radiation needs to pass through less material and is absorbed less. The low absorption losses in the attenuated phase shift patterning device MA means that there is more radiation to interfere, which leads to a larger NILS.

The relatively low k of the patterning device MA is required to properly balance the amplitudes of the diffraction orders. Unless there is a low k, there may not be enough radiation left in the reflected patterned EUV radiation beam B' to sufficiently suppress the intensity of the zeroth diffraction order. However, it has been realised that it is important to understand the optimum amount of k. This is because there is a need to balance the diffraction orders.

It will be appreciated that the second component does not need to have the optimum n and k values in order to obtain at least some of these benefits to at least some extent. In other embodiments, the material of the second component may have a refractive index with a real part (n) being less than 0.95 and an imaginary part (k) being less than 0.04. Materials having a refractive index falling within these limits may also provide a relatively high NILS and a relatively low pattern shift. These materials may be, for example, Rhodium (Rh), Technetium (Tc), Molybdenum (Mo) and Rhenium (Re). Thus, the second component may comprise one or more of Ru, Rh, Tc, Mo and Re. In other embodiments, the second component may comprise an alloy comprising one or more of Ru, Rh, Tc, Mo and Re.

It will also be appreciated that advantages may also be obtained when the thickness of the Ru is not 35 or 41 nm, as may be seen in FIGS. 3 and 4. In other embodiments, the thickness of the second component comprising the material Ru may be in the range 30 to 45 nm. That is, the thickness of the second component may be greater than or equal to 30 nm and the thickness of the second component may be less than or equal to 45 nm. In other embodiments, the second component may have a thickness in a range 33 nm to 41 nm. That is, the second component may have a thickness of greater than or equal to 33 nm and the second component may have a thickness less than or equal to 41 nm.

It will be appreciated that in embodiments where the second component has a material of at least one of Rh, Tc, Mo and Re, or an alloy of at least one of the elements Ru, Rh, Tc, Mo and Re, the thickness of the second component may vary accordingly, e.g. in order to obtain the best results.

Figure 5:
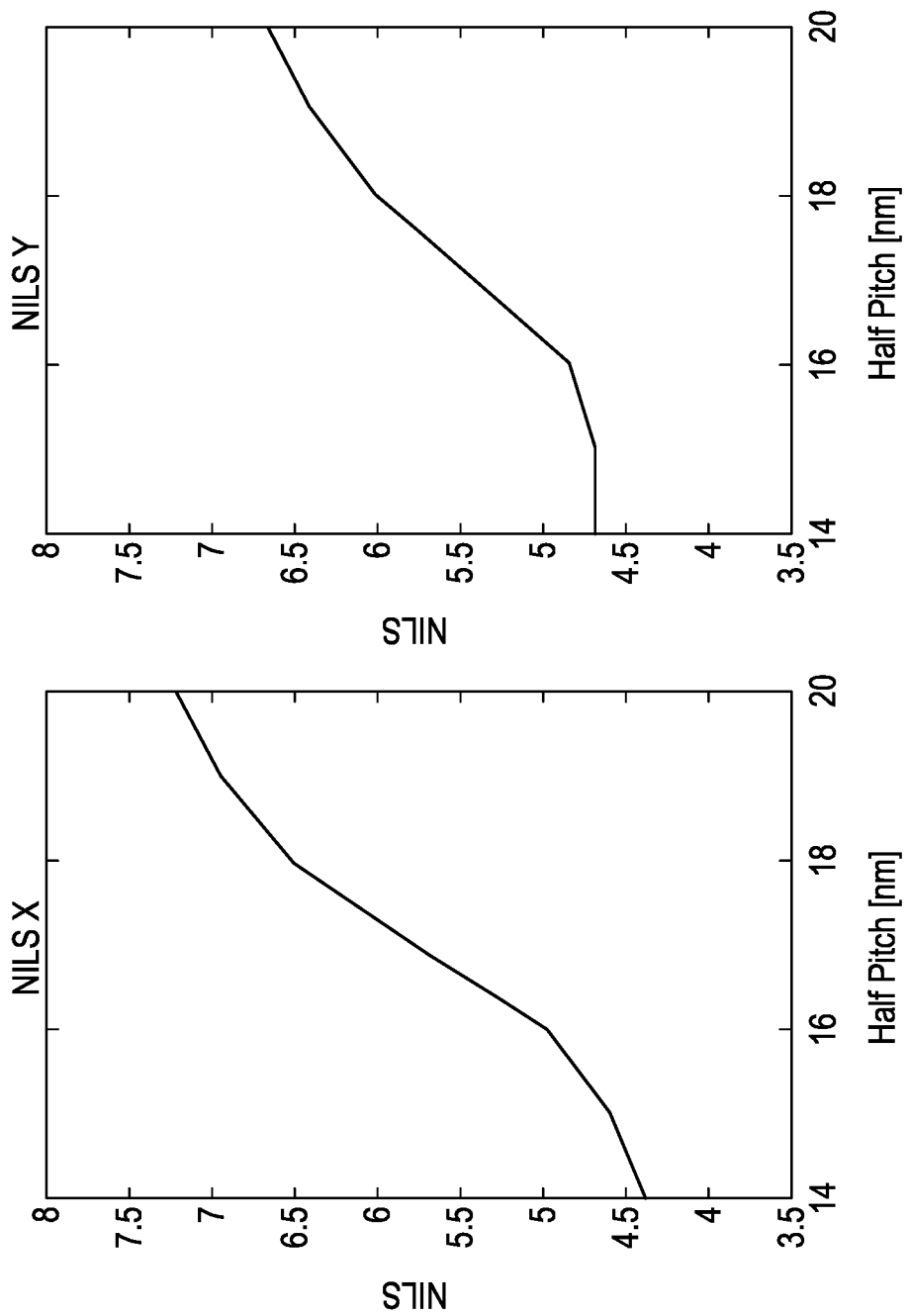
FIG. 5 depicts graphs showing NILS over a range of Half Pitch (HP) of an attenuated phase shift patterning device in accordance with an embodiment of the invention.
Figure 6:
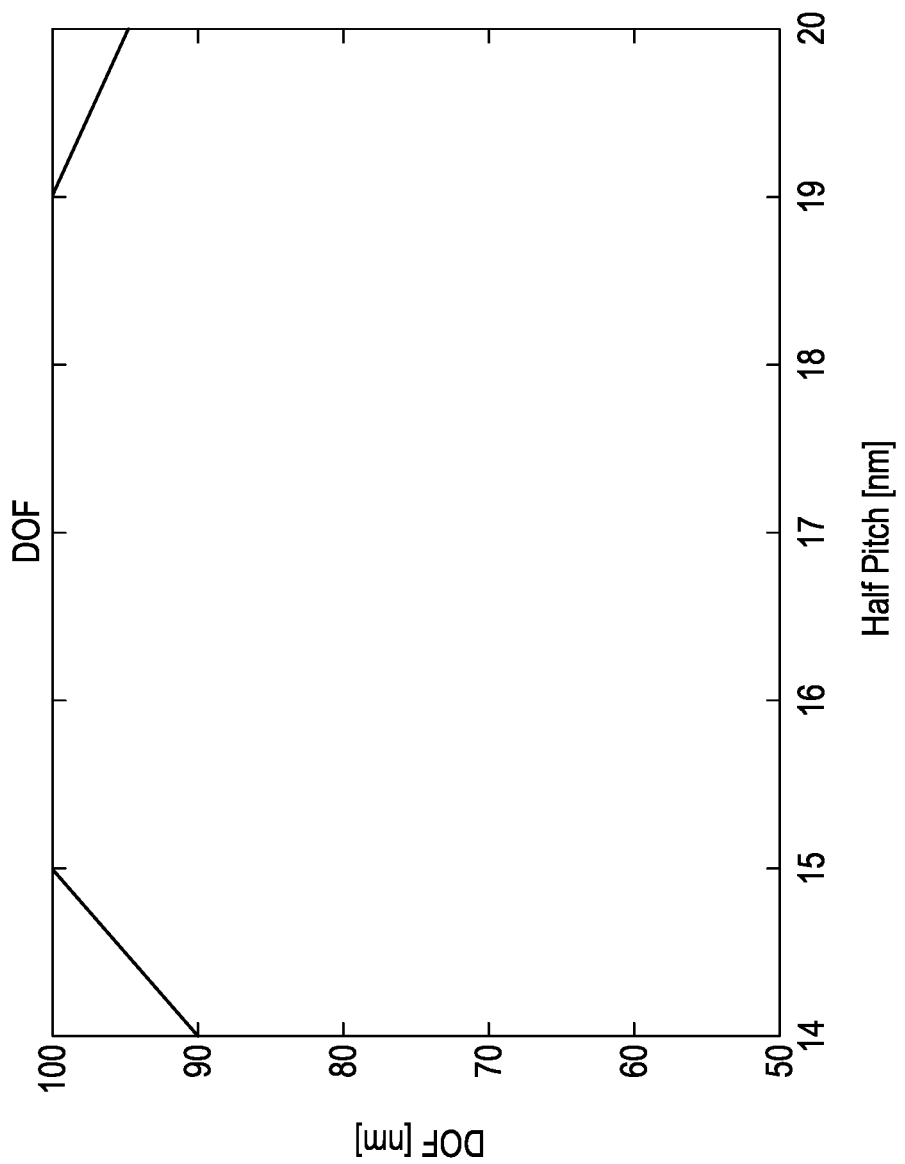
FIG. 6 depicts a graph showing depth of focus (DOF) over a range of Half Pitch (HP) of an attenuated phase shift patterning device in accordance with an embodiment of the invention.

FIGS. 5 and 6 show the performance of the attenuated phase shift patterning device MA of FIG. 2. That is, with the second component 24 of the attenuated phase shift patterning device MA comprising the material Ru. The results shown in FIGS. 5 and 6 are obtained by combining the attenuated phase shift patterning device MA with an optimized pupil (i.e. one single pupil for the whole pitch range).

More particularly, FIG. 5 shows a graph on the left hand side with the NILS values for a cross section over contact hole along the X direction, and a graph on the right hand side shows the NILS values for a cross section along the Y direction, for a range 14-20 nm of half pitch (HP). Half pitch (HP) refers to half the distance between two features formed on the substrate W. The graphs show that both the NILS-X and the NILS-Y values are above 4 for the whole range of HP. Thus, there is a relatively very large NILS through focus, throughout the whole 14-20 nm half pitch (HP) range, when compared with a standard patterning device.

FIG. 6 shows a graph of depth of focus (DOF) over the 14-20 nm half pitch (HP) range. The DOF is between 90 to 100 nm (inclusive) over the full range of HP. This is a substantially larger DOF than a standard Ta patterning device, which may have a DOF of e.g. 20 nm.

Therefore, the attenuated phase shift patterning device MA provides a relatively high NILS and DOF over a full range of HP. This is surprising as typically materials would have varying NILS and DOF for different values of HP over this range. This would mean that the patterning device would need to be changed each time a different HP was being used. Thus, the attenuated phase shift patterning device MA may reduce the requirement to change components in the lithographic apparatus LA. This may result in an increase in efficiency in using the lithographic apparatus LA for different HPs.

As mentioned above, the pattern may have a plurality of uncovered portions 22a of the first component 22 and the pattern may be dense or isolated. The attenuated phase shift patterning device MA shown in FIG. 2 works very well for dense patterns, but for isolated patterns, it leads to the addition of a background in the aerial image.

FIG. 7a shows an example of an isolated pattern that may be located on a patterning device 26. The features (e.g. uncovered portions) 27 reflect the radiation whilst the portion 28 of the patterning device does not reflect radiation strong enough to create a pattern on the substrate W. FIG. 7b shows the aerial image of the attenuated phase shift patterning device MA of FIG. 2 (i.e. with a second component comprising the material Ru). FIG. 7c shows the desired aerial image, i.e. having no background.

As may be seen from FIG. 7b, there is a background 29 in the aerial image which is not shown in the desired aerial image of FIG. 7c. This background 29 is due to the reduced absorption coefficient of the phase-shifting material (in this case Ru) compared to Ta. The background 29 will lead to undesired resist conversion in the isolated areas of the pattern and therefore is desired to be suppressed.

Figure 8B:
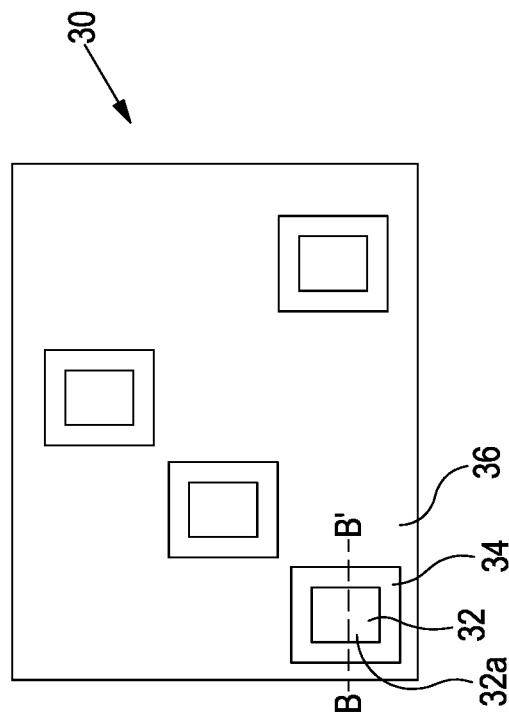
Figure 8A:
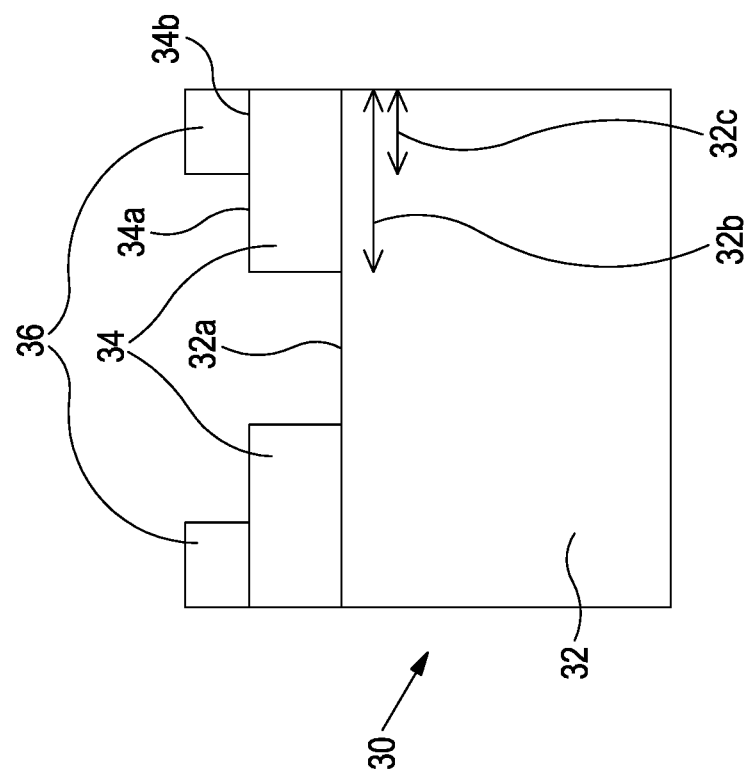
FIG. 8a depicts a schematic diagram of a cross sectional side view of an attenuated phase shift patterning device in accordance with another embodiment of the invention.

FIG. 8a shows a side view of an embodiment of part of an attenuated phase shift patterning device 30. More particularly, FIG. 8a shows a cross sectional side view of the attenuated phase shift patterning device 30 taken through line B-B' of FIG. 8b. The attenuated phase shift patterning device 30 is shown more fully in FIG. 8b in a top view.

The attenuated phase shift patterning device 30 is similar to the attenuated phase shift patterning device MA, except, in addition to a first component 32 and a second component 34, there is a third component 36 covering a portion of the first component 32. More particularly, in this embodiment, the third component 36 covers a portion of the second component 34 such that the second component 34 has an uncovered portion 34a and a covered portion 34b. The second component 34 may be considered to form a ring around the uncovered portion 32a of the first component 32.

In this embodiment, the third component 36 is not located directly on the first component 32, i.e. the second component 34 is located between the first component 32 and the third component 36. That is, the second component 34 is in a different layer from the third component 36. However, the third component 36 may still be considered to be covering a portion of the first component 32, even with the second component 34 located therebetween. More generally, the third component 36 covers at least a portion of the second component 34. The third component 36 may have a thickness in the range 30 nm to 50 nm. That is, the thickness of the third component 36 may be greater than or equal to 30 nm and the thickness of the second component may be less than or equal to 50 nm. It will be appreciated that, in other embodiments, the third component may have a different thickness.

The first component 32 and the second component 34 may be the same as in the attenuated phase shift patterning device MA of FIG. 2, that is the first component 32 is a multilayer and the second component 34 may comprise Ru. In other embodiments, the second component 34 may comprise, for example, Rh, Tc, Mo or Re. The second component 34 may comprise an alloy of Ru, Rh, Tc, Mo or Re. These materials may have a refractive index with a relatively low real part n (e.g. less than 0.95) and a relatively low imaginary part k (e.g. less than 0.04). Thus, the second component 34 provides the phase shift and thereby enhances the contrast in the same way as described above. That is, the benefits of the attenuated phase shift patterning device MA of FIG. 2 are also achieved using the attenuated phase shift patterning device 30.

In the same way as in FIG. 2, the second component 34 covers a portion (i.e. a covered portion 32b) of the first component 32 except for an uncovered portion 32a of the surface of the first component 22 which forms a pattern. The third component 36 covers a second covered portion 32c of the first component 32, which is smaller than the covered portion 32b of the first component 32 that is covered by the second component 32.

The third component 36 covers the second covered portion 32c of the first component 32 being a distance of 20 nm away from the uncovered portion 32a of the first component 32. In other embodiments, the second covered portion 32c may be greater than a distance of 20 nm away from the uncovered portion 32a of the first component 32. For example, the second covered portion 32c may be in a range 20 nm to 240 nm away from the uncovered portion 32a of the first component 32. The distance being taken parallel to the surface of the first component 32. The range 20 nm-240 nm may be calculated based on a critical dimension (CD) of the feature to be printed on the substrate W of 10 nm to 30 nm. The distance the second covered portion 32c is away from the uncovered portion 32a of the first component 32 may be in a range 0.5*CD to 1*CD. A magnification factor from the substrate W to the patterning device 30 may be 4-8 and so this provides a range 20 nm to 240 nm. It will be appreciated that, in other embodiments, the distance may be changed accordingly based on the CD.

As can be seen in FIG. 8b, the third component 36 covers the entire second component 34 except for an area surrounding the uncovered portion 32a of the first component 32 which extends a distance of 20 nm away from the uncovered portion 32a. As detailed above, in other embodiments, this distance may be in the range 20 nm-240 nm.

The third component 36 is for absorbing radiation. The third component 36 comprises an alloy of Ta with a Ru capping layer. This Ru capping layer is in addition to the second component 34 which may also be Ru. The Ta alloy has a refractive index with a relatively high imaginary part (k). In other embodiments, the material may comprise Ta without another element present. In other embodiments, the third component may comprise a different material, such as Ag, Pt, Pd, Au, Ir, Os, Re, In, Co, Cd, Pb, Fe, Hg, Tl, Cu, Zn, I, Te, Ga, Cr, W, Hf or an alloy comprising one or more of these materials, or a TaBN absorber. More generally, the third component 36 may comprise a material having a refractive index with a larger imaginary part (k) than the material of the second component 34, i.e. in this embodiment Ru. In some embodiments, the third component 36 may have a material having a refractive index with an imaginary part (k) in the range 0.031 (i.e. k of TaBN) to 0.08 (i.e. k of Ag). As an example, the imaginary part (k) may be 0.065 (i.e. k of Co).

The third component 36 is deposited on the second component 34 and absorbs radiation and suppresses the background intensity when the pattern contains isolated features (isolated uncovered portions 32a). Using the attenuated phase shift patterning device 30 may result in an aerial image such as shown in FIG. 7c.

The attenuated phase shift patterning device 30 may be used in the lithographic apparatus LA by reflecting radiation from the first component 32 of the attenuated phase shift patterning device 30, reflecting radiation from the second component 34 of the attenuated phase shift patterning device 30, and absorbing radiation by the third component 36 of the attenuated phase shift patterning device 30. More particularly, reflecting radiation from the pattern comprising the uncovered portion 32a of the first component 32 and generating the patterned radiation beam B'. The effect of this is that the radiation reflected from the second component 34 has a different phase with respect to the radiation reflected from the first component 32 and provides a pattern on the substrate with increased contrast. The absorbing of the radiation by the third component 36 leads to at least a reduction of the background.

The part of the attenuated phase shift patterning device 30 which is not covered by the third component 36 may be considered to be an unpatterned part. Since the unpatterned part of attenuated phase shift patterning device 30 consists of highly absorbing material, i.e. the third component 36 comprising Ta, the background in the aerial image will be suppressed.

Thus, the attenuated phase shift patterning device 30 is suitable for isolated features in a pattern and provides strongly enhanced NILS through focus.

Figure 9B:
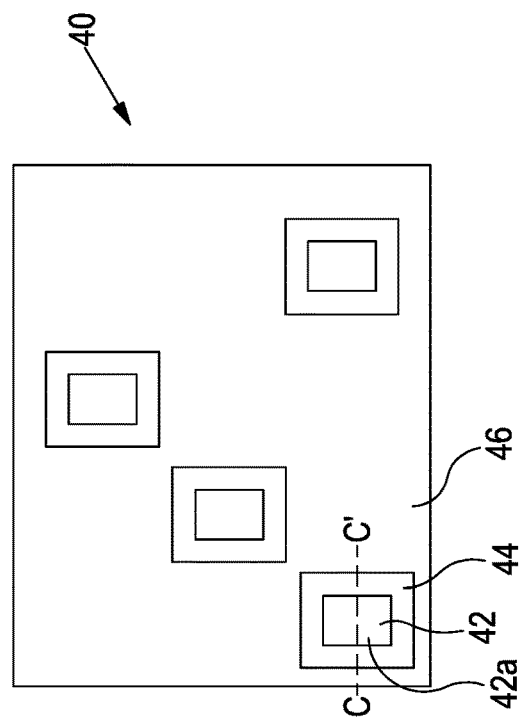
Figure 9A:
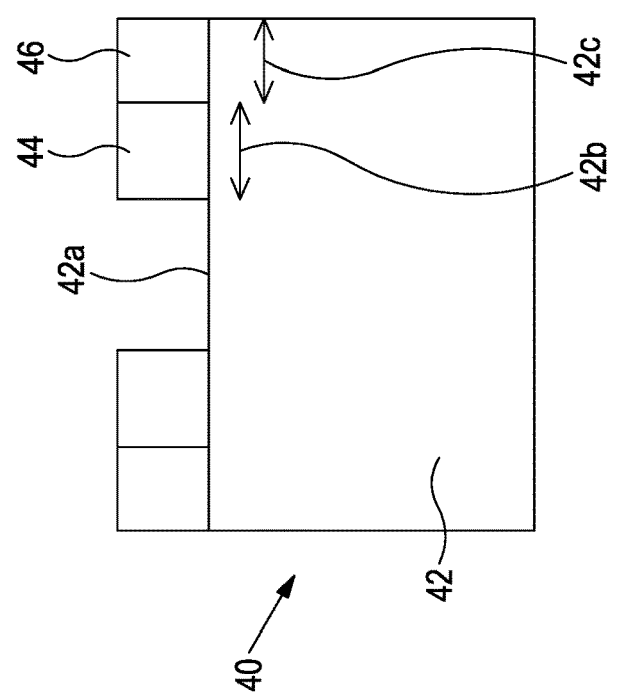
FIG. 9a depicts a schematic diagram of a cross sectional side view of an attenuated phase shift patterning device in accordance with another embodiment of the invention.

FIG. 9a shows a side view of an embodiment of part of an attenuated phase shift patterning device 40. More particularly, FIG. 9a shows a cross sectional side view of the attenuated phase shift patterning device 40 taken through line C-C' of FIG. 9b. The attenuated phase shift patterning device 40 is shown more fully in FIG. 9b in a top view.

The attenuated phase shift patterning device 40 is similar to the attenuated phase shift patterning device 30, except, the second component 44 is in the same layer as the third component 46. That is, the third component 46 does not cover the second component 44. This means that the attenuated phase shift patterning device 40 is thinner than the attenuated phase shift patterning device 30. The attenuated phase shift patterning device 30 may have advantages of ease of manufacture.

In the attenuated phase shift patterning device 40, the second component 44 covers a covered portion 42b of a first component 42 and the third component 46 covers a different, second covered portion 42c, which does not overlap with the covered portion 42b. This is different from the attenuated phase shift patterning device 30 where the covered portion 32b and second covered portion 32c overlap to some extent.

As can be seen in FIGS. 9a and 9b, the third component 46 covers the entire first component 42 except for the uncovered portion 42a of the first component 42 and the covered portion 42b of the first component 42 covered by the second component 44. The second component 44 may be considered to form a ring around the uncovered portion 42a of the first component 42. Similarly, the third component 46 may be considered to form a ring around the second component 44.

Again, the third component 46 is made from Ta or an alloy of Ta. In other embodiments, the third component may comprise a different material, such as Co or an alloy of Co, or TaBN.

The third component 46 absorbs radiation and suppresses the background intensity in the same way as the attenuated phase shift patterning device 30 of FIG. 8. Using the attenuated phase shift patterning device 40 may result in an aerial image such as shown in FIG. 7c. Thus, the attenuated phase shift patterning device 40 is suitable for isolated features (i.e. isolated uncovered portions 42a) in a pattern and provides strongly enhanced NILS through focus.

Figure 10B:
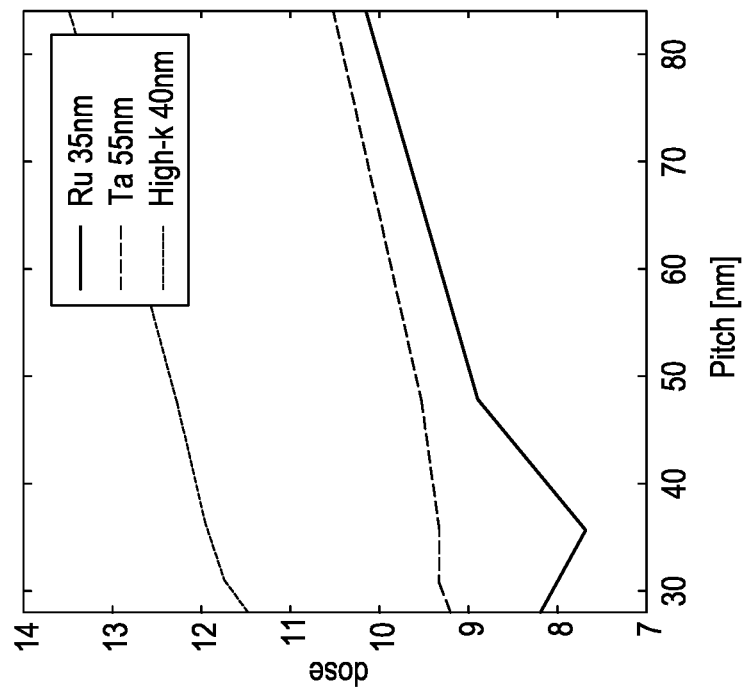
Figure 10A:
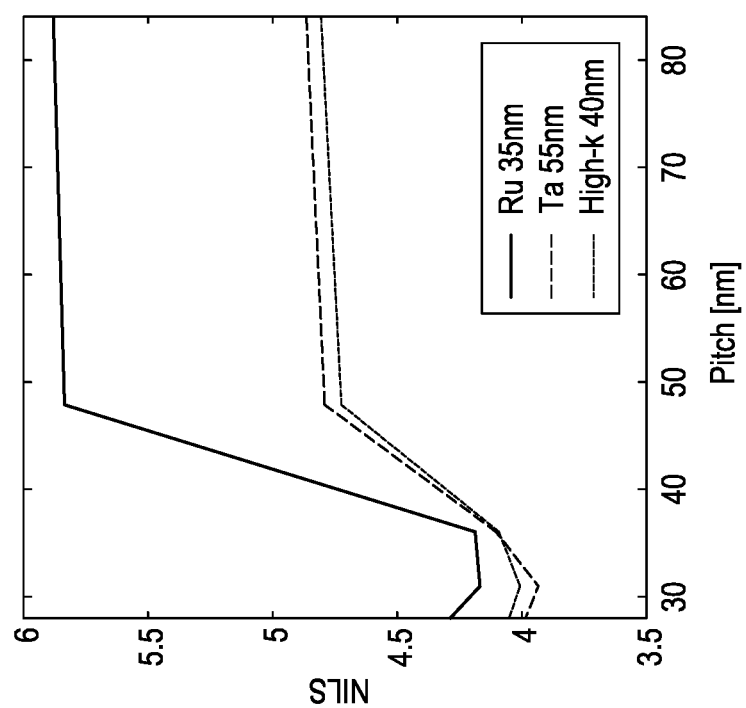
FIG. 10a depicts a graph showing NILS through pitch for patterning devices having different materials.

FIG. 10a shows a graph of NILS through pitch (nm) for features with a constant critical dimension (CD) of 14 nm (14 nm contact holes—CH) for patterning devices (masks) having different materials. Specifically, the different masks are a standard Ta based patterning device, a patterning device with a relatively high k absorber (i.e. a mask having a material with n similar to Ta and higher k—e.g. Co or Ni), and the Ru patterning device.

The high k mask only gives a very slight NILS gain with respect to the standard Ta mask. For all pitches the Ru mask shows the largest NILS. For example, the observed NILS increase goes up to 46% for the Ru mask with respect to the other masks at 48 nm pitch.

FIG. 10b shows a graph of the dose for the same features and masks as in FIG. 10a. It can be seen that the Ru mask shows the best dose over the entire pitch range, since absorption losses in this mask are the smallest. The "best" dose is the lowest dose. Lower dose is beneficial as this means less radiation is needed to print the same features which improved throughput. However, there is the problem of the addition of a background in the aerial image.

Figure 11:
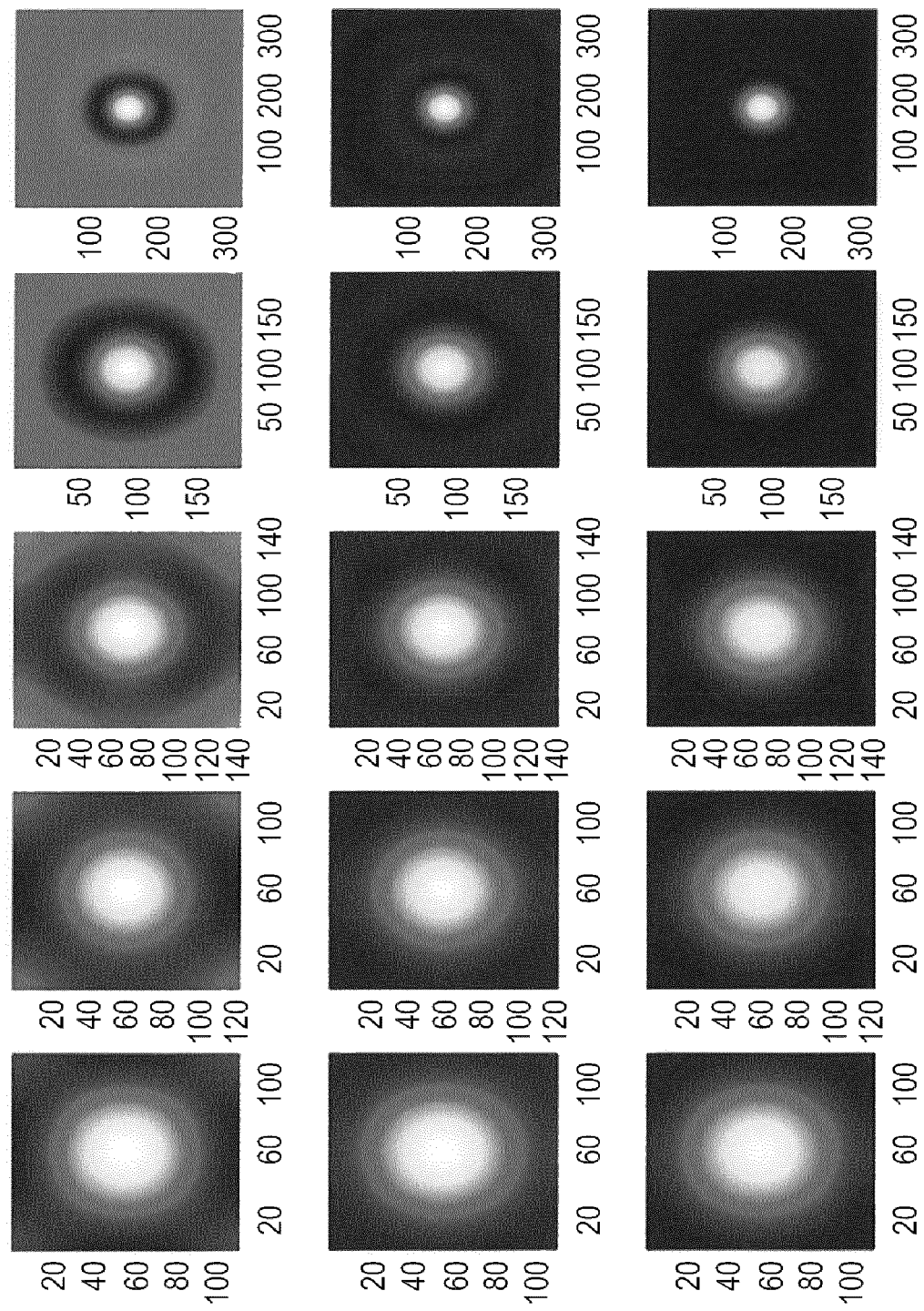
FIG. 11 depicts isolated patterns aerial images having different background intensity levels for different patterning devices.

FIG. 11 shows examples of the aerial image of the patterning devices with different materials (i.e. with different second components) through pitch. The numerals on the axes are the number of pixels in the image. As an example, the left most image has an axis length of 28 nm and the right most image has an axis length of 84 nm. More particularly, the different mask types are shown from top to bottom: Ru based attenuated PSM, Ta mask and high-k mask, and the pitches are from left to right: 28, 31, 36, 48, 84 nm.

As mentioned, the top row shows the Ru based mask. It can be observed that, with respect to the other masks, a high background intensity is observed (i.e. less of a dark area around the feature). For small pitches we observe side-lobes and with increasing pitch this turns into a full background. The background intensity is around the resist's threshold and would lead to undesired resist exposure on the substrate W.

Figure 12B:
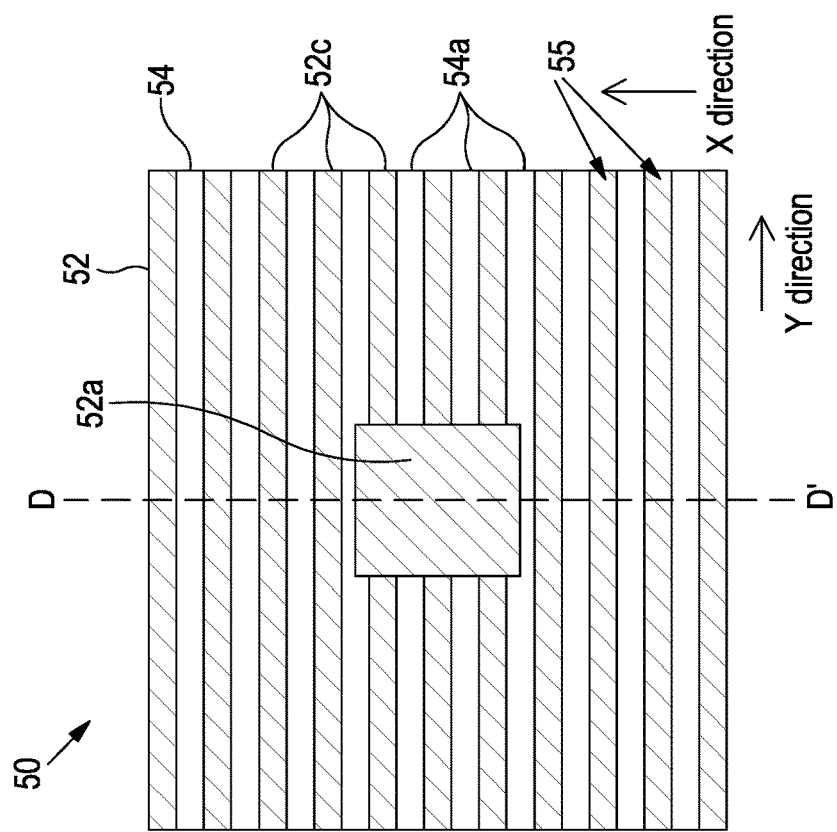
Figure 12A:
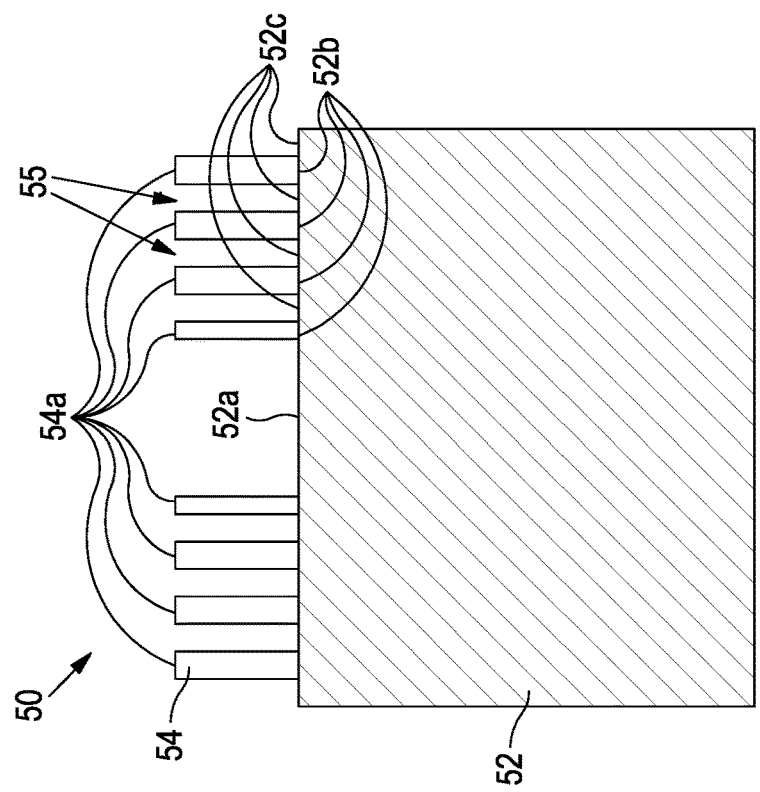
FIG. 12a depicts a schematic diagram of a cross sectional side view of an attenuated phase shift patterning device in accordance with another embodiment of the invention.

FIG. 12a shows a side view of an embodiment of part of an attenuated phase shift patterning device 50. More particularly, FIG. 12a shows a cross sectional side view of part of the attenuated phase shift patterning device 50 taken through line D-D' of FIG. 12b. Part of the attenuated phase shift patterning device 50 is shown in FIG. 8b in a top view.

The attenuated phase shift patterning device 50 is similar to the attenuated phase shift patterning device 20, except it has a different arrangement of a second component 54 covering a first component 52. More particularly, in this embodiment, the second component 54 has an arrangement of sections 54a of the second component 54 across the attenuated phase shift patterning device 50 with channels 55 separating adjacent sections 54a of the second component 54. When viewed from the top as in FIG. 12b there is a channel 55 and then a section 54a of the second component 54 and then another channel 55 and then another section 54a of the second component 54 and so on across the attenuated phase shift patterning device 50 in the X direction (i.e. the direction perpendicular to the scanning direction of the lithographic apparatus LA). The sections 54a of the section component extend over the entire attenuated phase shift patterning device 50. Thus, there is a repeating pattern of sections 54a of the second component 54 across the patterning device 50 in the X direction. In FIG. 12b, ten sections 54a of the second component 54 are shown with eleven channels 55 being located adjacent to the sections 54a of the second component 54. However, in other embodiments, it will be appreciated that there could be more or less sections of the second component and corresponding numbers of channels adjacent to the sections of the second component.

In this embodiment, there is no second component fully surrounding an uncovered portion of the first component similar to the attenuated phase shift patterning device 20. However, in some embodiments, there may be a second component surrounding the first component in this way and at least part of the benefit of attenuated phase shift patterning device 50 described below may still be achieved.

As can be seen in FIGS. 12a and 12b, the second component 54 covers the entire first component 52 (i.e. covered portions 52b of the first component 52) except for an uncovered portion 52a of the first component 52 and further uncovered portions 52c of the first component 52 where the channels 55 are located. These further uncovered portions 52c do not result in corresponding features being formed in the substrate W (as the uncovered portion 52a does) as will become apparent.

In this embodiment, the widths of the sections 54a of the second component 54 and the widths of the channel 55, and thus the widths of the further uncovered portions 52c are substantially the same. However, in other embodiments, the widths may be different, both between different sections 54a and/or between the sections 54a and the channels 55.

The arrangement of the second component 54 of the attenuated phase shift patterning device 50 is configured such that the sections 54a of the second component 54 extend in the Y direction (i.e. the scanning of the lithographic apparatus LA) when the patterning device 50 is positioned in the lithographic apparatus LA for use. More generally, the sections 54a of the second component 54 extend perpendicularly to the direction of the repeating pattern across the patterning device 50. In other embodiments, the sections 54a of the second component 54 may have a different orientation, e.g. they may extend in the X direction while the repeating pattern is across the patterning device in the Y direction.

The second component 54 may be considered to form thin horizontal lines on the patterning device 50 with the channels 55 being between the lines. This pattern of repeating horizontal lines may be the most preferable solution for manufacturing the mask. In other embodiments, the second component 54 may have a different pattern. For example, a matrix of small regular holes (i.e. spaces) that extend in both the X and Y directions may be used. More generally, the patterning device has the arrangement of the second component such that there is a repeating pattern of sections of the second component across the patterning device (e.g. in the X direction). The sections of the second component are separated by spaces (c.f. channels) to uncover the further uncovered portions of the first component.

The first component 52 and the second component 54 may be made the same as in the attenuated phase shift patterning device MA of FIG. 2, that is the first component 52 is a multilayer and the second component 54 may comprise Ru. In other embodiments, the second component 54 may comprise, for example, Rh, Tc, Mo or Re. The second component 54 may comprise an alloy of Ru, Rh, Tc, Mo or Re. These materials may have a refractive index with a relatively low real part n (e.g. less than 0.95) and a relatively low imaginary part k (e.g. less than 0.04). Thus, the second component 54 provides the phase shift and thereby enhances the contrast in the same way as described above. That is, the benefits of the attenuated phase shift patterning device MA of FIG. 2 are also achieved using the attenuated phase shift patterning device 50.

The arrangement of the second component 54 has a sub-resolution pitch. That is, the distance between the sections 54a of the second component 54 (i.e. the pitch) is below the resolution that is printed on the substrate W. This means that the further uncovered portions 52c of the first component 52 will not be printed on the substrate W. The further uncovered portions 52c of the first component 52 which are located below the channels 55 are sub resolution assist features (SRAF). In examples, the at resolution pitch may be 26 nm or 16 nm and so the line pitch may be less than 26 nm or less than 16 nm respectively. The critical dimension (CD) of the lines is about half of the pitch and so less than 13 nm or less than 8 nm.

More generally, the arrangement of the second component 54 forms a repeating pattern on the patterning device 50. This arrangement is configured to reduce the radiation diffracted into the zeroth (0th) diffraction order. Diffraction by patterns results in having only a relatively low amount of radiation in the zeroth order.

The further uncovered portions 52c of the first component 52 diffract the background radiation such that a relatively low amount of the radiation goes into the zeroth order, e.g. when compared to the Ru based patterning devices that produce the aerial images as shown in FIG. 11. The described arrangement may result in a substantially strongly suppressed zeroth order. Thus, as little as possible of the radiation is in the zeroth order and more radiation is in the $1^{st}$ and higher orders. The $1^{st}$ and higher orders may be outside the numerical aperture (NA) of the lithographic apparatus LA. This means less radiation will be incident on the substrate W and so the background radiation issue will be improved.

FIG. 13 shows a graph of an exemplary indication of amplitude ratio to higher diffraction orders using the attenuated phase shift patterning device 50. The graph schematically shows the distribution of the diffracted radiation over the orders with the attenuated phase shift patterning device 50 for these types of features. With a standard Ta mask most of the radiation goes into the 0th order. With the attenuated phase shift patterning device 50 the radiation that is diffracted into the zeroth diffraction order is less than the radiation diffracted into higher diffraction orders. As an example, 80% of the radiation may be diffracted outside the zeroth order. However, there may be no limit and preferably the horizontal lines would diffract 100% of the radiation outside the zeroth order, which would remove all of the background radiation as shown in FIG. 11.

With the attenuated phase shift patterning device 50 the features can be tweaked (pitch and mask bias) to get most of the radiation outside the 0th order. Therefore, the background radiation problem will be improved. The pitch is sub-resolution but, at the sub-resolution pitch, it is possible to e.g. make the pitch even smaller or to tune the size (e.g. width) of the lines (sections 54a of the second component 54) in such a way that further increases the amount of radiation that is diffracted out of the zeroth order. Mask bias is the size of the lines (sections 54a of the second component 54). For example, a pitch of 20 nm may be used. That can mean that there are alternating lines of 10 nm and channels of 10 nm. However, it could also mean that there are alternating lines of 12 nm and channels of 8 nm. Both these examples have a pitch of 20 but in the first case there is bias of 0 and in the second case there is a bias of +2. The attenuated phase shift patterning device 50 provides an enhanced NILS and improved dose whilst suppressing background for isolated patterns. This, in turn will improve yield and throughput of the lithographic apparatus LA.

As previously mentioned, different materials may be used as the second component 24 in FIGS. 2a and 2b. In an embodiment, the second component 24 comprises an alloy of Ruthenium (Ru) and Cobalt (Co) with a thickness t (shown as a double arrow in FIGS. 2a and 2b) of approximately 41 nm. That is, the alloy may be referred to as RuCo41. The material RuCo of the second component 24 may be considered to have replaced an absorbing material, e.g. a TaBN absorber, in a standard patterning device to form the attenuated phase shift patterning device MA.

The RuCo acts as a phase shift material and it has been found to be a particularly good material to use in the attenuated phase shift patterning device MA. Furthermore, the thickness of 41 nm has been found to provide an optimal phase shift. The second component 24 made of RuCo may have a thickness t of 40.7 nm. As will be appreciated, in other embodiments, different thicknesses may also be used, as detailed later.

Co may have a refractive index with a real part (n) of 0.934 and an imaginary part (k) of 0.0662. Ru may have a refractive index with a real part (n) of 0.886 and an imaginary part (k) of 0.017. An alloy of ⅔ Ru and ⅓ Co (i.e. 2*Ru+1*Co) may have a refractive index with a real part (n) of 0.902 and an imaginary part (k) of 0.034. This is the refractive index for EUV radiation of 13.5 nm wavelength.

As mentioned, RuCo may have a refractive index with a real part (n) of 0.902 and an imaginary part (k) of 0.034. This relatively low real part (n) and relatively low imaginary part (k) means that similar benefits are obtained as with using Ru as described above in relation to FIGS. 2a and 2b, e.g. producing a larger Normalised Image Log Slope (NILS) when compared with a standard Ta patterning device. Ta-based masks are limited in optical contrast (NILS) and dose. Thus, alternatives are desired for low-k1 EUV imaging. Low-k1 may be considered to be k1<0.4. K1 indicates how close to the resolution limit the lithographic apparatus LA is operating. Lower k1 means a smaller pitch. The theoretically smallest k1 is 0.25, and at this level the lithographic apparatus LA would print features at its smallest possible resolution.

Figure 14:
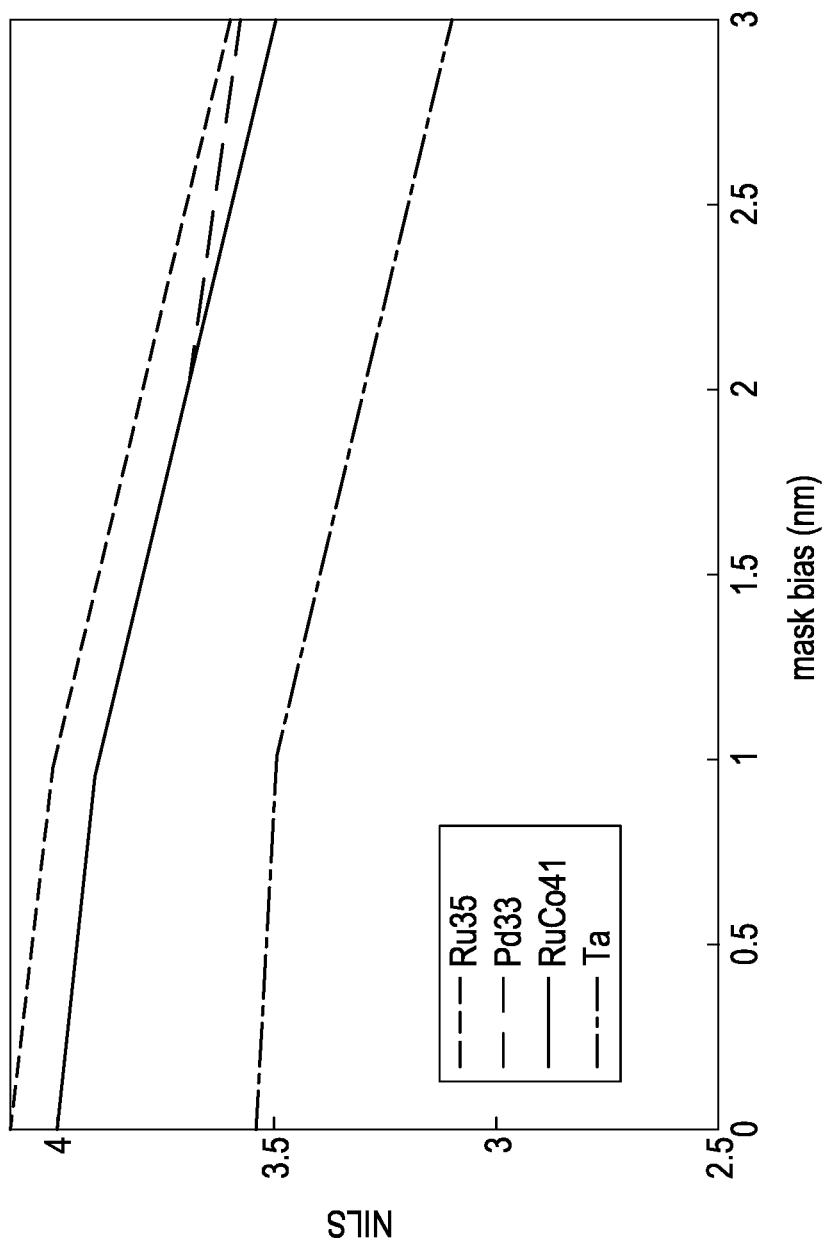
FIG. 14 depicts a graph showing NILS through mask bias for different patterning devices including a patterning device in accordance with an embodiment.

FIG. 14 is a graph of the performance for different masks (patterning devices), i.e. the mask bias (nm) against NILS. The mask bias is the width of the uncovered portion 22a, i.e. the hole in the second component 24 (see FIGS. 2a and 2b). To print a feature, a certain dose is required and certain NILS needs to be achieved. By calculating NILS/Dose$^{0.5}$ these two metrics may be combined into a single value. Preferably, NILS/Dose$^{0.5}$ is as high as possible, and this will result in an improved uniformity (lower LCDU). NILS/dose$^{0.5}$ may be used as a metric as this is proportional to 1/LCDU (Local Critical Dimension Uniformity).

Table 1 shows the characteristic of the masks shown in FIG. 14.

| Mask | n | k | Thickness | Reflectivity |
|---|---|---|---|---|
| Ru35 | 0.886 | 0.017 | 35 nm | 30% |
| Pd33 | 0.876 | 0.047 | 33 nm | 6% |
| RuCo41 | 0.902 | 0.034 | 41 nm | 8% |
| Ta-based | 0.95 | 0.031 | 60 nm | 2% |

The graph of FIG. 14 shows Ru35—i.e. a mask having Ru with a thickness of 35 nm, Pd33—a mask having Pd with a thickness of 33 nm, Ta60—a mask having Ta with a thickness of 60 nm, and RuCo41—a mask having an alloy of RuCo with a thickness of 41 nm.

The Ru35 mask provides high transmission but this also brings negative aspects as will be described, the Pd33 mask may not be compatible in the lithographic apparatus LA, the Ta60 mask provides sub-optimal performance—i.e. NILS is too low. Although the RuCo41 mask has a lower NILS than the Ru35 mask, it still provides a relatively high NILS which is close to the NILS of the Ru35 mask. It can be seen that the mask with RuCo41 provides a higher NILS gain with respect to the Ta based mask across the range of mask bias.

Figure 15:
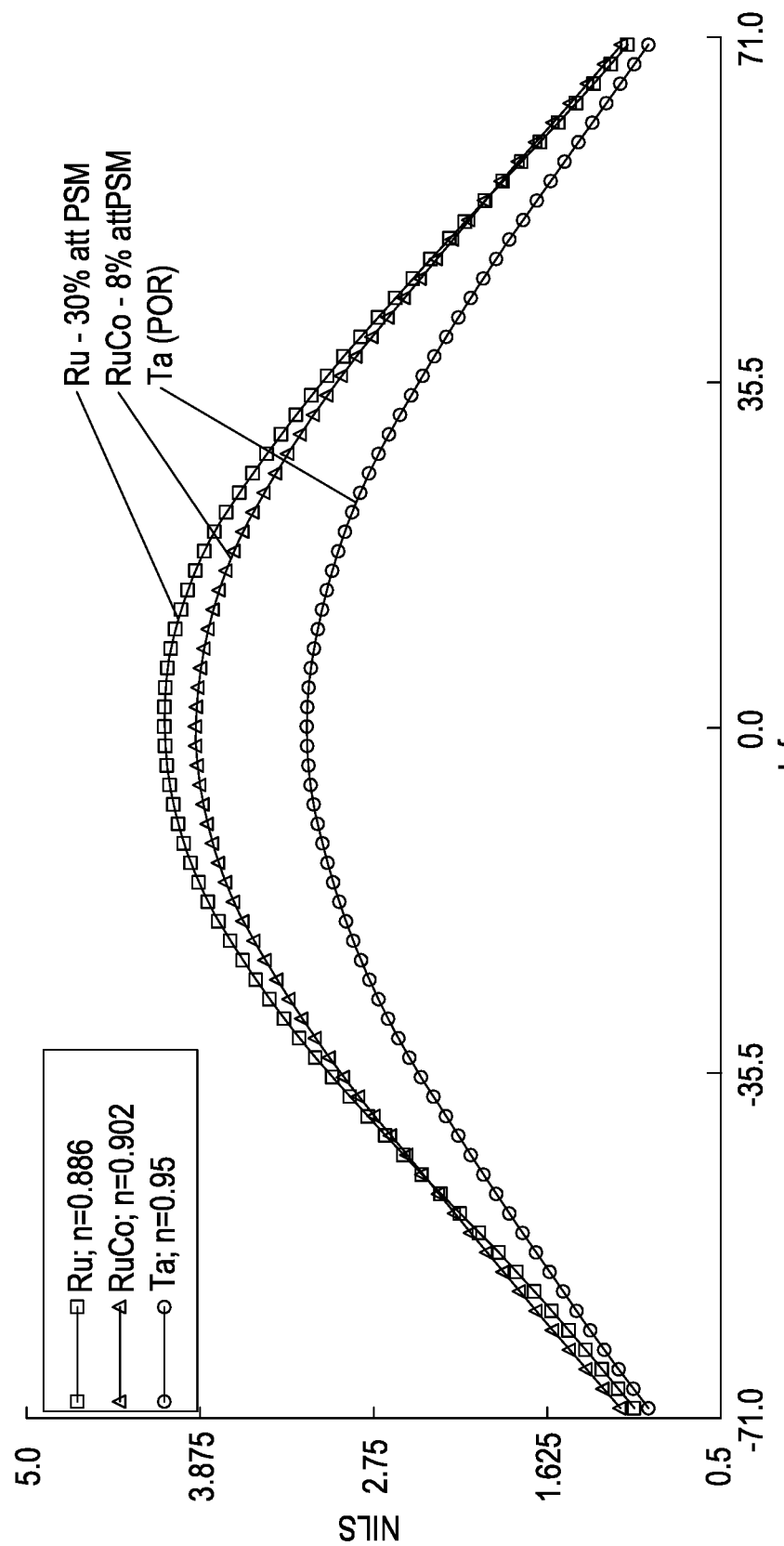
FIG. 15 depicts a graph showing NILS through defocus for different patterning devices including a patterning device in accordance with an embodiment.

FIG. 15 is a graph showing a comparison of NILS for different masks across a defocus range. Defocus is the focus position of the wafer stage. Preferably, the wafer is always at the best possible focus position (which has to be determined per feature) but there is a certain focus budget (i.e. the wafer is not always exactly at the best focus position) so how the imaging performs through wafer focus is used. More particularly, a mask made of Ru (i.e. Ru35), a mask made of RuCo (i.e. RuCo41) and a mask made of Ta (Ta60) is shown. In this case the Ta absorber mask is taken as the current baseline, so that is the point of reference (POR) in comparison to the phase shift patterning device MA (PSM). The Ru mask may provide 30% reflectivity (i.e. attenuation) and the RuCo mask may provide 8% reflectivity (attenuation). The amount of attenuation depends on both the thickness & the material. More generally, a RuCo mask will have more attenuation than Ru masks. It can be seen that there is about a 23% NILS improvement over the Ta based mask for the RuCo mask. The Ru mask has a larger NILS than the RuCo mask but the performance is relatively close. The point of reference (POR) for Ta varies per use case and feature size. Typically more than a 10% improvement with Ru and RuCo may be expected in comparison to Ta. In other embodiments the NILS improvement may be 12-23% better when using the RuCo mask compared with using the Ta based mask.

As mentioned, RuCo41 has less attenuation of the radiation than a Ru35 mask. More generally, RuCo has less attenuation of the radiation than using only Ru as the material of the second component 24. There is less attenuation of the radiation since RuCo41 has a higher refractive index imaginary part (k) than Ru35. That is, the second component 24 made of RuCo will reflect less radiation than the second component 24 made of Ru. The reflection may be considered to be a double pass transmission (i.e. the radiation passes once through the second component 24, is reflected from the first component 22 and then passes through the second component 24 again). As an example, RuCo41 may have approximately 8% attenuation whereas Ru35 may have 30% attenuation. The example of RuCo with ⅔ Ru and ⅓ Co with a thickness of 40.7 nm may have 7.6% attenuation (i.e. a 7.6% transmission of radiation after a double pass through the material). The reflectively of the Ru mask results in background printing in isolated areas, i.e. isolated features and marks, (similar to as shown and described above with respect to FIG. 7b). The background is due to the reduced absorption coefficient of the phase-shifting material (in this case Ru) compared to Ta. The background will lead to undesired resist conversion in the isolated areas of the pattern and therefore is desired to be suppressed. The reflectivity of the Ru mask may be considered to be relatively high.

Since the RuCo41 mask has a reduced reflectivity when compared to the Ru35 mask then using RuCo41 as the material of the second component 24 leads to a reduction in (or elimination of) background in the aerial image for isolated features when compared to e.g. using only Ru as the second component 24. Since less radiation is reflected from the RuCo41. Thus, using RuCo41 means that the use of tritone masks (adding an additional layer to an area not used for exposure in order to mask unused regions—similar to as shown in FIG. 8a and 8b or 9a and 9b) or SRAFs (sub resolution assist features—similar to as shown in FIGS. 12a and 12b) can be avoided, which may reduce cost.

It will be appreciated that the second component does not need to have the n and k values mentioned above for RuCo, and does not need to be made from RuCo, in order to obtain at least some of these benefits to at least some extent. In embodiments, the material of the second component may have a refractive index with a real part (n) being less than 0.91. This allows the mask 3D effects to be suppressed. In embodiments, the material of the second component may have a refractive index with an imaginary part (k) being less than 0.04. In embodiments, the material of the second component may have a refractive index with an imaginary part (k) greater than 0.031. This means that the transmission of the radiation through the second component is low enough to suppress the background as less radiation will thus be incident on the resist. An increased absorption coefficient of the phase-shifting material (in this case RuCo) compared to Ru means that background is reduced. Transmission is in first approximation only determined through k. In embodiments, k should be large enough such that the double pass Transmission is less than 10%. When k is calculated for 10% transmission through the double pass absorber then k=0.0303.

It will also be appreciated that advantages may also be obtained when the thickness of the RuCo is not 41 nm. In other embodiments, the thickness of the second component comprising the material RuCo may be in the range 34 to 55 nm. That is, the thickness of the second component may be greater than or equal to 34 nm and the thickness of the second component may be less than or equal to 55 nm. In other embodiments, the second component may have a thickness in a range 34 nm to 55 nm. That is, the second component may have a thickness of greater than or equal to 34 nm and the second component may have a thickness less than or equal to 55 nm.

Patterning devices which have a second component made of materials with these characteristics may be referred to as low reflectivity attenuated phase shift patenting devices or low transmission attenuated phase shift masks (low T att PSM). Materials having a refractive index falling within these ranges may provide a relatively high NILS and a relatively low pattern shift whilst also reducing (or eliminating) background printing in isolated areas. These materials may be, for example Ru, Pt, Ta or Co. Thus, the second component may comprise one or more of Ru, Pt, Ta or Co. In other embodiments, the second component may comprise an alloy comprising one or more of Ru, Pt, Ta or Co. The materials may be compatible to be used within the lithographic apparatus LA, e.g. silver (Ag) and palladium (Pd) may not be suitable for use in the lithographic apparatus LA. The phase shift produced by the patterning device MA may be 1.27c to provide the desired performance, i.e. highest NILS and low mask 3D effects.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims and clauses set out below.

1. An attenuated phase shift patterning device comprising:
a first component for reflecting radiation, and
a second component for reflecting radiation with a different phase with respect to the radiation reflected from the first component, the second component covering at least a portion of the surface of the first component such that a pattern comprising at least one uncovered portion of the first component is formed for generating a patterned radiation beam in a lithographic apparatus in use,
wherein the second component comprises a material having a refractive index with a real part (n) being less than 0.95 and an imaginary part (k) being less than 0.04.

2. The attenuated phase shift patterning device of clause 1, wherein the second component comprises at least one of Ru, Rh, Tc and Re.

3. The attenuated phase shift patterning device of clause 2, wherein the second component comprises an alloy comprising at least one of Ru, Rh, Tc and Re.

4. The attenuated phase shift patterning device of any preceding clause, wherein the second component has a thickness in the range 30 to 45 nm.

5. The attenuated phase shift patterning device of clause 4, wherein the second component has a thickness of 35 or 41 nm.

6. The attenuated phase shift patterning device of any preceding clause, wherein the second component covers the portion of the first component which extends a distance of at least 10 nm from the at least one uncovered portion of the first component.

7. The attenuated phase shift patterning device of any preceding clause, further comprising a third component for absorbing radiation, the third component comprising a material having a refractive index with a larger imaginary part (k) than the material of the second component, the third component covering at least a portion of the first component or the second component.

8. The attenuated phase shift patterning device of clause 7, wherein the material of the third component has a refractive index with an imaginary part (k) in the range 0.031 to 0.08.

9. The attenuated phase shift patterning device of either of clauses 7 or 8, wherein the third component covers the portion of the first component which is greater than or equal to a distance in the range 20 to 240 nm from the at least one uncovered portion of the first component.

10. The attenuated phase shift patterning device of any of clauses 7-9, wherein the third component does not cover the second component.

11. The attenuated phase shift patterning device of any of clauses 7-9, wherein the third component covers at least a portion of the second component.

12. The attenuated phase shift patterning device of any of clauses 7-11, wherein the third component comprises at least one of Ta, Ag, Pt, Pd, Au, Ir, Os, Re, In, Co, Cd, Pb, Fe, Hg, TI, Cu, Zn, I, Te, Ga, Cr, W, Hf, TaBN, or an alloy comprising one or more of Ta, Ag, Pt, Pd, Au, Ir, Os, Re, In, Co, Cd, Pb, Fe, Hg, TI, Cu, Zn, I, Te, Ga, Cr, W, and Hf.

13. The attenuated phase shift patterning device of any of clauses 1-5, wherein the second component has an arrangement configured to reduce the radiation diffracted into the zeroth diffraction order and wherein the arrangement has a sub-resolution pitch.

14. The attenuated phase shift patterning device of clause 13, wherein the radiation diffracted into the zeroth diffraction order is less than the radiation diffracted into higher diffraction orders.

15. The attenuated phase shift patterning device of either of clauses 13 or 14, wherein the arrangement has a repeating pattern of sections of the second component across the attenuated phase shift patterning device, the sections of the second component being separated by spaces such that there are further uncovered portions of the first component.

16. The attenuated phase shift patterning device of clause 15, wherein the sections of the second component extend perpendicularly to the direction of the repeating pattern across the attenuated phase shift patterning device, the sections of the second component being separated by channels.

17. The attenuated phase shift patterning device of clause 1, wherein the second component comprises a material having a refractive index with a real part (n) of less than 0.91 and an imaginary part (k) greater than 0.03.

18. The attenuated phase shift patterning device of clause 17, wherein the second component comprises at least one of Ru, Pt, Ta or Co.

19. The attenuated phase shift patterning device of clause 18, wherein the second component comprises an alloy of Ru and Co.

20. The attenuated phase shift patterning device of clause 19, wherein the second component comprises an alloy of 2/3 Ru and 1/3 Co.

21. The attenuated phase shift patterning device of any of clauses 17-20, wherein the second component has a thickness in the range 34-55 nm.

22. The attenuated phase shift patterning device of any of clause 21, wherein the second component has a thickness of 41 nm.

23. The attenuated phase shift patterning device of any of clauses 1-22, wherein the first component is a multilayer.

24. A method of using an attenuated phase shift patterning device, comprising:
  reflecting radiation from a first component of the attenuated phase shift patterning device, and
  reflecting radiation from a second component of the attenuated phase shift patterning device such that the radiation reflected from the second component has a different phase with respect to the radiation reflected from the first component, the second component covering at least a portion of the surface of the first component such that a pattern comprising at least one uncovered portion of the first component is formed for generating a patterned radiation beam,
  wherein the second component comprises a material having a refractive index with a real part (n) being less than 0.95 and an imaginary part (k) being less than 0.04.

25. The method of clause 24, further comprising absorbing radiation using a third component having a refractive index with a larger imaginary part (k) than the second component, the third component covering at least a portion of the first component.

The invention claimed is:
1. An attenuated phase shift patterning device comprising:
  a first component configured to reflect radiation, and
  a second component configured to reflect radiation with a different phase with respect to the radiation reflected from the first component, the second component covering at least a portion of a surface of the first component such that a pattern comprising at least one uncovered portion of the first component is formed to generate a patterned radiation beam in a lithographic apparatus in use, wherein the second component comprises a material having a refractive index with a real part (n) being less than 0.91 for the radiation and an imaginary part (k) being less than 0.04 and more than 0.03 for the radiation,
  wherein the phase shift produced by the patterning device is $1.2\pi$ radians, and
  wherein double pass transmission of the second component is less than 10%, and
  wherein the second component has a thickness selected from in the range 34 nm to 55 nm.

2. The patterning device of claim 1, wherein the second component comprises at least one selected from Ru, Rh, Tc and/or Re.

3. The patterning device of claim 2, wherein the second component comprises an alloy comprising at least one selected from Ru, Rh, Tc and/or Re.

4. The patterning device of claim 1, wherein the second component has a thickness selected from in the range 34 nm to 45 nm.

5. The patterning device of claim 1, wherein the second component covers a portion of the first component, the second portion extending a distance of at least 10 nm from the at least one uncovered portion of the first component.

6. The patterning device of claim 1, further comprising a third component configured to absorb radiation, the third component comprising a material having a refractive index with a larger imaginary part (k) for the radiation than the material of the second component, the third component covering at least a portion of the first component or the second component.

7. The patterning device of claim 6, wherein the material of the third component has a refractive index with an imaginary part (k) selected from in the range 0.031 to 0.08 for the radiation.

8. The patterning device of claim 6, wherein the third component covers a portion of the first component, the portion of the first component starting to extend at a distance which is greater than or equal to a distance selected from in the range of 20 nm to 240 nm from the at least one uncovered portion of the first component.

9. The patterning device of claim 6, wherein the third component comprises at least one selected from: Ta, Ag, Pt, Pd, Au, Ir, Os, Re, In, Co, Cd, Pb, Fe, Hg, TI, Cu, Zn, I, Te, Ga, Cr, W, Hf, TaBN, or an alloy comprising one or more selected from: Ta, Ag, Pt, Pd, Au, Ir, Os, Re, In, Co, Cd, Pb, Fe, Hg, TI, Cu, Zn, I, Te, Ga, Cr, W, and/or Hf.

10. The patterning device of claim 1, wherein the second component comprises at least one selected from Ru, Pt, Ta and/or Co.

11. The patterning device of claim 10, wherein the second component comprises an alloy of Ru and Co.

12. The patterning device of claim 11, wherein the second component comprises an alloy of 2/3 Ru and 1/3 Co.

13. The patterning device of claim 1, further comprising a third component configured to absorb radiation, the third component covering at least a portion of the first component or the second component.

14. The patterning device of claim 1, wherein the second component has an arrangement having features with a sub-resolution pitch and configured to reduce the radiation diffracted into the zeroth diffraction order, the features comprising a plurality of features each extending continuously along and past a side of the at least one uncovered portion or comprising a plurality of features arranged in a regular pattern along and past a side of the at least one uncovered portion.

15. The patterning device of claim 14, wherein the radiation diffracted into the zeroth diffraction order is less than the radiation diffracted into higher diffraction orders.

16. The patterning device of claim 14, wherein the arrangement has a repeating pattern of sections of the second component across the attenuated phase shift patterning device, the sections of the second component being separated by spaces such that there are further uncovered portions of the first component.

17. The patterning device of claim 16, wherein the sections of the second component extend perpendicularly to the direction of the repeating pattern across the attenuated phase shift patterning device, the sections of the second component being separated by channels.

18. A method comprising:
reflecting radiation from a first component of an attenuated phase shift patterning device, and
reflecting radiation from a second component of the attenuated phase shift patterning device such that the radiation reflected from the second component has a different phase with respect to the radiation reflected from the first component, the second component covering at least a portion of a surface of the first component such that a pattern comprising at least one uncovered portion of the first component is formed for generating a patterned radiation beam,
wherein the second component comprises a material having a refractive index with a real part (n) being less than 0.91 for the radiation and an imaginary part (k) being less than 0.04 and more than 0.03 for the radiation,
wherein the phase shift produced by the patterning device is $1.2\pi$ radians, and
wherein double pass transmission of the second component is less than 10%, and
wherein the second component has a thickness selected from in the range 34 nm to 55 nm.

19. The method of claim 18, further comprising absorbing radiation using a third component comprising a material having a refractive index with a larger imaginary part (k) for the radiation than the material second component, the third component covering at least a portion of the first component or the second component.

20. An attenuated phase shift patterning device comprising:
a first component configured to reflect radiation, and
a second component configured to reflect radiation with a different phase with respect to the radiation reflected from the first component, the second component covering at least a portion of a surface of the first component such that a pattern comprising at least one uncovered portion of the first component is formed to generate a patterned radiation beam in a lithographic apparatus in use,
wherein the second component comprises a material having a refractive index with a real part (n) being less than 0.95 for the radiation and an imaginary part (k) being less than 0.04 for the radiation,
wherein the phase shift produced by the patterning device is $1.2\pi$ radians,
wherein double pass transmission of the second component is less than 10%, and
wherein the material comprises Ru.

21. The patterning device of claim 20, wherein the second component has an arrangement having features with a sub-resolution pitch and configured to reduce the radiation diffracted into the zeroth diffraction order, each of the features being elongate, each of the features not being connected to each other, and at least one of the features located at each side of the at least one uncovered portion of the first component.

22. The patterning device of claim 20, wherein the second component has a thickness selected from in the range 34 nm to 55 nm.

* * * * *